United States Patent
Kim et al.

(10) Patent No.: US 10,199,389 B2
(45) Date of Patent: *Feb. 5, 2019

(54) NON-VOLATILE MEMORY DEVICE

(71) Applicant: Samsung Electronics Co., Ltd., Suwon-si OT (KR)

(72) Inventors: Jong-Won Kim, Hwaseong-si (KR);
Chang-Seok Kang, Seongnam-si (KR);
Young-Woo Park, Seoul (KR);
Jae-Goo Lee, Suwon-si (KR); Jae-Duk Lee, Seongnam-si (KR)

(73) Assignee: SAMSUNG ELECTRONICS CO., LTD., Samsung-ro, Yeongtong-gu, Suwon-si, Gyeonggi-do (KR)

( * ) Notice: Subject to any disclaimer, the term of this patent is extended or adjusted under 35 U.S.C. 154(b) by 0 days.

This patent is subject to a terminal disclaimer.

(21) Appl. No.: 15/485,334

(22) Filed: Apr. 12, 2017

(65) Prior Publication Data

US 2017/0229476 A1     Aug. 10, 2017

Related U.S. Application Data

(63) Continuation of application No. 15/264,902, filed on Sep. 14, 2016, now Pat. No. 9,646,984.

(30) Foreign Application Priority Data

Sep. 25, 2015  (KR) .................. 10-2015-0136347

(51) Int. Cl.
*H01L 27/1157* (2017.01)
*H01L 27/11582* (2017.01)
(Continued)

(52) U.S. Cl.
CPC .... *H01L 27/11582* (2013.01); *H01L 23/5283* (2013.01); *H01L 27/1157* (2013.01); *H01L 27/11565* (2013.01)

(58) Field of Classification Search
CPC ............ H01L 27/1152; H01L 27/1157; H01L 29/7926; H01L 29/66833; H01L 29/792
See application file for complete search history.

(56) References Cited

U.S. PATENT DOCUMENTS 8,187,932 B2    5/2012  Nguyen et al.
8,742,488 B2 *  6/2014  Lee ..................... H01L 27/1157
                                                          257/211
(Continued)

FOREIGN PATENT DOCUMENTS

KR   10-2013-0080983    10/2013
KR   10-2014-0093106     7/2014

*Primary Examiner* — Cuong Q Nguyen
(74) *Attorney, Agent, or Firm* — Muir Patent Law, PLLC

(57) ABSTRACT

A non-volatile memory device is provided. The non-volatile memory device includes a channel structure that is located on a substrate and extends perpendicularly to the substrate, a conductive pattern that extends perpendicularly to the substrate and is spaced apart from the channel structure, an electrode structure that is located between the channel structure and the conductive pattern, and comprises a plurality of gate patterns and a plurality of insulation patterns that are alternately laminated. An insulating layer that contacts with a top surface of the conductive pattern is formed along side surfaces of the electrode structure. The top surface of the conductive pattern is formed to be lower than the top surface of the channel structure.

30 Claims, 25 Drawing Sheets

(51) Int. Cl.
*H01L 27/11565* (2017.01)
*H01L 23/528* (2006.01)

(56) References Cited

U.S. PATENT DOCUMENTS

| | | |
|---|---|---|
| 8,946,809 B2 | 2/2015 | Takamura et al. |
| 9,023,702 B2 | 5/2015 | Lee |
| 9,646,984 B2 * | 5/2017 | Kim .................... H01L 27/1157 |
| 2012/0205722 A1 | 8/2012 | Lee |
| 2014/0054675 A1 | 10/2014 | Lee et al. |
| 2015/0118804 A1 | 4/2015 | Sasago et al. |
| 2015/0129954 A1 | 5/2015 | Kim et al. |
| 2015/0132915 A1 | 5/2015 | Park et al. |
| 2015/0137210 A1 | 5/2015 | Nam et al. |
| 2015/0145015 A1 | 5/2015 | Shin et al. |
| 2015/0145020 A1 | 5/2015 | Kim et al. |
| 2018/0026050 A1 * | 1/2018 | Lee .................... H01L 27/1157 |

* cited by examiner

NON-VOLATILE MEMORY DEVICE

This continuation application claims domestic priority from parent U.S. application Ser. No. 15/264,902 filed on Sep. 14, 2016 and foreign priority from Korean Patent Application No. 10-2015-0136347 filed on Sep. 25, 2015 in the Korean Intellectual Property Office (KIPO), disclosures of both applications being incorporated herein by reference in their entirety.

TECHNICAL FIELD

The herein disclosed subject matter relates to a non-volatile memory device.

BACKGROUND

A semiconductor memory device is a storage device that is achieved using a semiconductor material typically from the Group IV elements or compounds such as, silicon (Si), germanium (Ge), gallium arsenide (GaAs) or indium phosphide (InP) and the like. Semiconductor memory devices are largely classified into volatile memory devices and non-volatile memory devices.

In a volatile memory device saved data disappears when the supply of a power source cuts off. Types of volatile memory devices include a static RAM (SRAM), a dynamic RAM (DRAM), synchronous DRAM (SDRAM) and the like. In a non-volatile memory device the saved data is maintained even when the supply of a power source cuts off. Types of non-volatile memory devices include a flash memory device, a read only memory (ROM), a programmable ROM (PROM), an electrically programmable ROM (EPROM), electrically erasable and programmable ROM (EEPROM), a resistive memory device (e.g., a phase-change RAM (PRAM), a ferroelectric RAM (FRAM), a resistive RAM (RRAM) and the like.

To satisfy the consuming public's demand for high performance and low priced semiconductor memory devices has led to increasing degrees of the integration of non-volatile memory devices. However, in the case of a two-dimensional or planar memory device, the degree of integration is limited by an area occupied by a unit memory cell. Thus, three-dimensional memory devices with vertically disposed unit memory cells have been recently developed.

Prior art memory cells are formed with common source line structures which extend perpendicularly from the substrate to a height of equal to or beyond that of adjacent channel structures. During the formation of these prior art devices a slit can be formed within the common source line structure. Moreover, during the memory cell formation processes, a concentration of F-gas can be generated which fills the slit. The filled slit can thereafter cause stress within the formed memory cell which increases the failure rate.

SUMMARY

Aspects of the present exemplary implementations of the herein described subject matter provide a non-volatile memory device with improved reliability by removing a slit generated in a common source line and by reducing stress.

According to exemplary implementations of the herein described subject matter, there is provided a non-volatile memory device comprising a channel structure that is located on a substrate and extends perpendicularly to the substrate, a conductive pattern that extends perpendicularly to the substrate and is spaced apart from the channel structure, an electrode structure that is located between the channel structure and the conductive pattern, and comprises a plurality of gate patterns and a plurality of insulation patterns that are alternately laminated; and an insulating layer that is in contact with a top surface of the conductive pattern and is formed along side surfaces of the electrode structure, wherein the top surface of the conductive pattern is formed to be lower than the top surface of the channel structure.

In some exemplary implementations, the top surface of the conductive pattern is formed to be higher than the top surface of the substrate.

In some exemplary implementations, the non-volatile memory device further comprises a spacer that is disposed between the conductive pattern and the electrode structure and is formed along side surfaces of the conductive pattern and side surfaces of the insulating layer, and a bottom surface of the conductive pattern is formed to be lower than a bottom surface of the spacer.

In some exemplary implementations, the plurality of gate patterns comprises first to n-th gate patterns (n is a natural number) that are sequentially laminated in a direction away from the substrate, and a top surface of the conductive pattern is disposed between the k-th gate pattern (k is a natural number smaller than n) and the k+1st gate pattern.

In some exemplary implementations, the non-volatile memory device further comprises a first interlayer insulating film that covers the channel structure and the electrode structure; and a metal contact structure that is in contact with the top surface of the conductive pattern through the first interlayer insulating film.

In some exemplary implementations, the non-volatile memory device further comprises a second interlayer insulating film that covers the first insulating interlayer film a first conductive stud that is disposed on the metal contact structure through the second interlayer insulating film and a second conductive stud that is disposed on the channel structure through the first and second interlayer insulating films.

In some exemplary implementations, the first conductive stud and the metal contact of the metal contact structure are integrally formed.

According to an exemplary implementation, there is provided a non-volatile memory device comprising a plurality of channel structures that are located on a substrate and extend perpendicularly to the substrate, a conductive pattern that extends perpendicularly to the substrate and is spaced apart from the channel structure, a first interlayer insulating film that covers the plurality of channel structures and the conductive pattern. A metal contact, disposed on the conductive pattern, is electrically connected to the conductive pattern, passes through the first interlayer insulating film, and has a bottom surface formed to be lower than top surfaces of the plurality of channel structures.

In some exemplary implementations, a top surface of the conductive pattern is formed to be higher than a top surface of the substrate and to be lower than the top surfaces of the plurality of channel structures.

In some exemplary implementations, the plurality of channel structures is disposed in a honeycomb shape.

In some exemplary implementations, the plurality of channel structures comprises a dummy channel structure and an active channel structure, and the dummy channel structure closest to the metal contact is disposed to be closer to the metal contact than the active channel structure.

In some exemplary implementations, the conductive pattern comprises a first portion including the metal contact, and a second portion adjacent to the first portion, and a width of the first portion measured in a first direction parallel to the top surface of the substrate is larger than a width of the second portion measured in the first direction.

According to an exemplary implementation, there is provided a non-volatile memory device comprising first and second channel structures that are located on a substrate and extend perpendicularly to the substrate, a conductive pattern that extends perpendicularly to the substrate and is spaced apart from the channel structures, a first interlayer insulating film that covers the plurality of channel structures and the conductive pattern, a second interlayer insulating film that covers the first interlayer insulating film, a metal contact that is disposed on the conductive pattern and penetrates through the first interlayer insulating film, a first conductive stud that is disposed on the metal contact, penetrates through the second interlayer insulating film and is electrically connected to the conductive pattern and a second conductive stud that is disposed only on the first channel structure, is not disposed on the second channel structure and penetrates through the first and second interlayer insulating films.

In some exemplary implementations, a distance between the first channel structure and the metal contact is larger than a distance between the first channel structure and the metal contact.

In some exemplary implementations, wherein the top surface of the conductive pattern is formed to be lower than the top surface of the channel structure.

However, exemplary implementations are not restricted to the ones set forth herein. The above and other exemplary implementations will become more apparent to those of ordinary skill in the art to which the herein described subject matter pertains by referencing the detailed description of the exemplary implementations given below.

Other specific matters of the exemplary implementations are included in the detailed description and the drawings.

Figure 1:
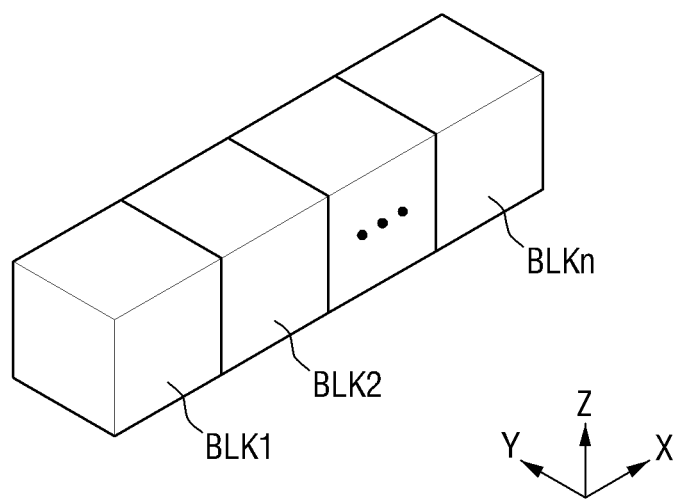
FIG. 1 is a conceptual diagram for explaining a non-volatile memory device according to some exemplary implementations.

The above and other aspects and features of the exemplary implementations will become more apparent by describing in detail exemplary embodiments thereof with reference to the attached drawings.

DETAILED DESCRIPTION OF THE EMBODIMENTS

Advantages and features of the exemplary implementations and methods of accomplishing the same may be understood more readily by reference to the following detailed description of preferred embodiments and the accompanying drawings. The exemplary implementations may, however, be embodied in many different forms and should not be construed as being limited to the embodiments set forth herein. Rather, these embodiments are provided so that this disclosure will be thorough and complete and will fully convey the concept of the disclosure to those skilled in the art, and the present inventive concepts will only be defined by the appended claims.

In the drawings, the thickness of layers and regions are exaggerated for clarity. It will be understood that when an element or layer is referred to as being "connected to," or "coupled to" another element or layer, it can be directly connected to or coupled to another element or layer or intervening elements or layers may be present. In contrast, when an element is referred to as being "directly connected to" or "directly coupled to" another element or layer, there are no intervening elements or layers present. Like numbers refer to like elements throughout. As used herein, the term "and/or" includes any and all combinations of one or more of the associated listed items.

It will also be understood that when a layer is referred to as being "on" another layer or substrate, it can be directly on the other layer or substrate, or intervening layers may also be present. In contrast, when an element is referred to as being "directly on" another element, there are no intervening elements present.

It will be understood that, although the terms first, second, etc. may be used herein to describe various elements, these elements should not be limited by these terms. These terms are only used to distinguish one element from another element. Thus, for example, a first element, a first component or a first section discussed below could be termed a second element, a second component or a second section without departing from the teachings of the present inventive concept.

The use of the terms "a" and "an" and "the" and similar referents in the context of describing the inventive concept (especially in the context of the following claims) are to be construed to cover both the singular and the plural, unless otherwise indicated herein or clearly contradicted by context. The terms "comprising," "having," "including," and "containing" are to be construed as open-ended terms (i.e., meaning "including, but not limited to,") unless otherwise noted.

Unless defined otherwise, all technical and scientific terms used herein have the same meaning as commonly understood by one of ordinary skill in the art to which this inventive concept belongs. It is noted that the use of any and all examples, or exemplary terms provided herein is intended merely to better illuminate the inventive concept and is not a limitation on the scope of the inventive concept unless otherwise specified. Further, unless defined otherwise, all terms defined in generally used dictionaries may not be overly interpreted.

In some exemplary implementations a three-dimensional (3D) memory array is provided. The three-dimensional memory array may be monolithically formed in one or more physical layers of a memory cell array that has an electrical circuitry associated with the operation of the memory cell, and an active area formed on a silicon substrate. The associated electrical circuitry may be formed inside or on the substrate. The term 'monolithic' may mean that layers of each level of the array are directly placed on the layers of each lower levels of the array.

In some exemplary implementations, the three-dimensional memory array may include a 'vertical NAND string' in which at least one memory cell is disposed on the other memory cell and vertically extends. At least one memory cell may include a charge storage film. The three-dimensional memory array may include bit lines and/or word lines shared between the levels, and a plurality of levels.

Hereinafter, a non-volatile memory device according to some exemplary implementations will be described with reference to FIGS. 1 to 25.

Figure 2:
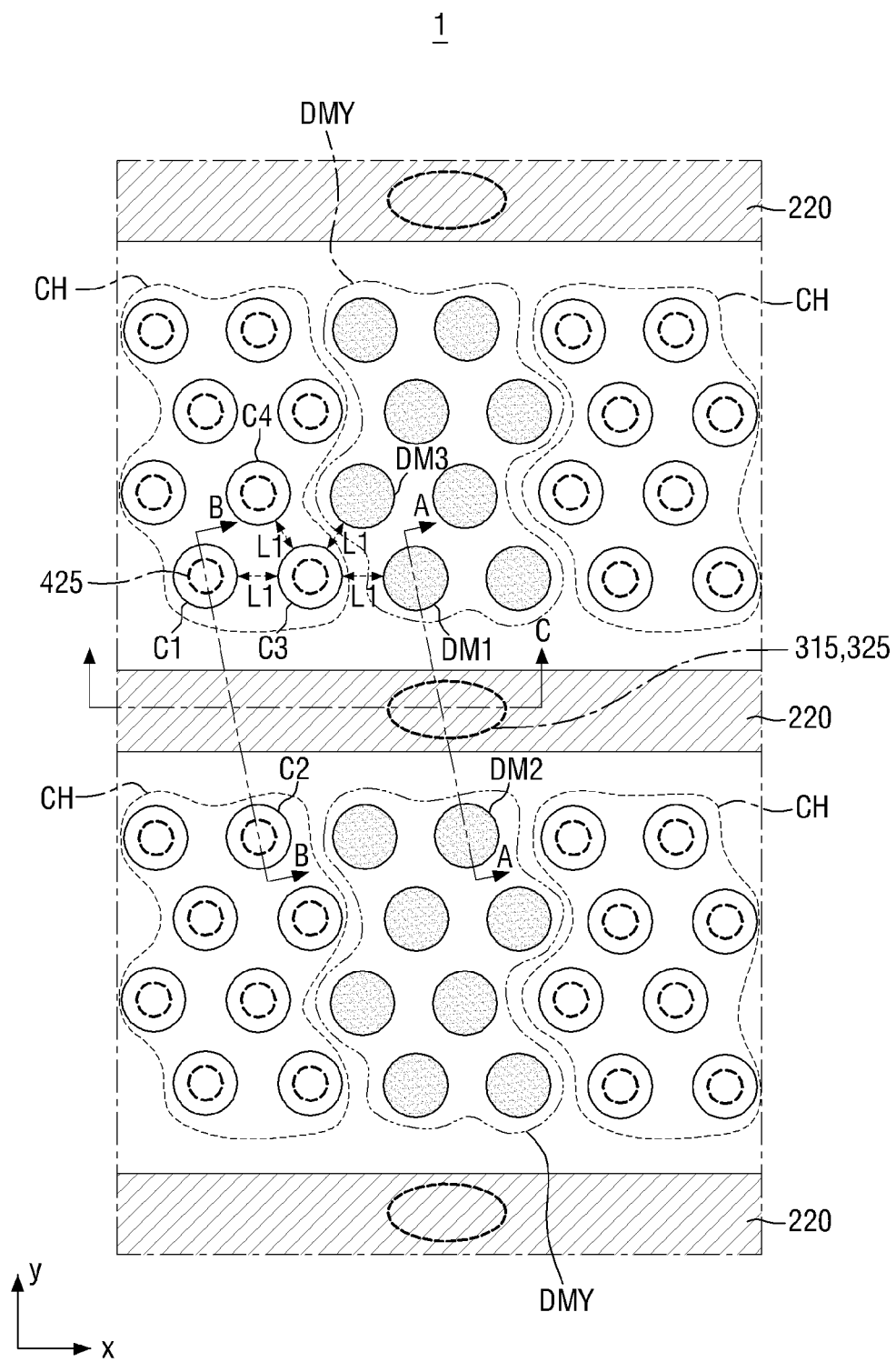
FIG. 2 is a layout diagram for explaining a non-volatile memory device according to some exemplary implementations.
Figure 3:
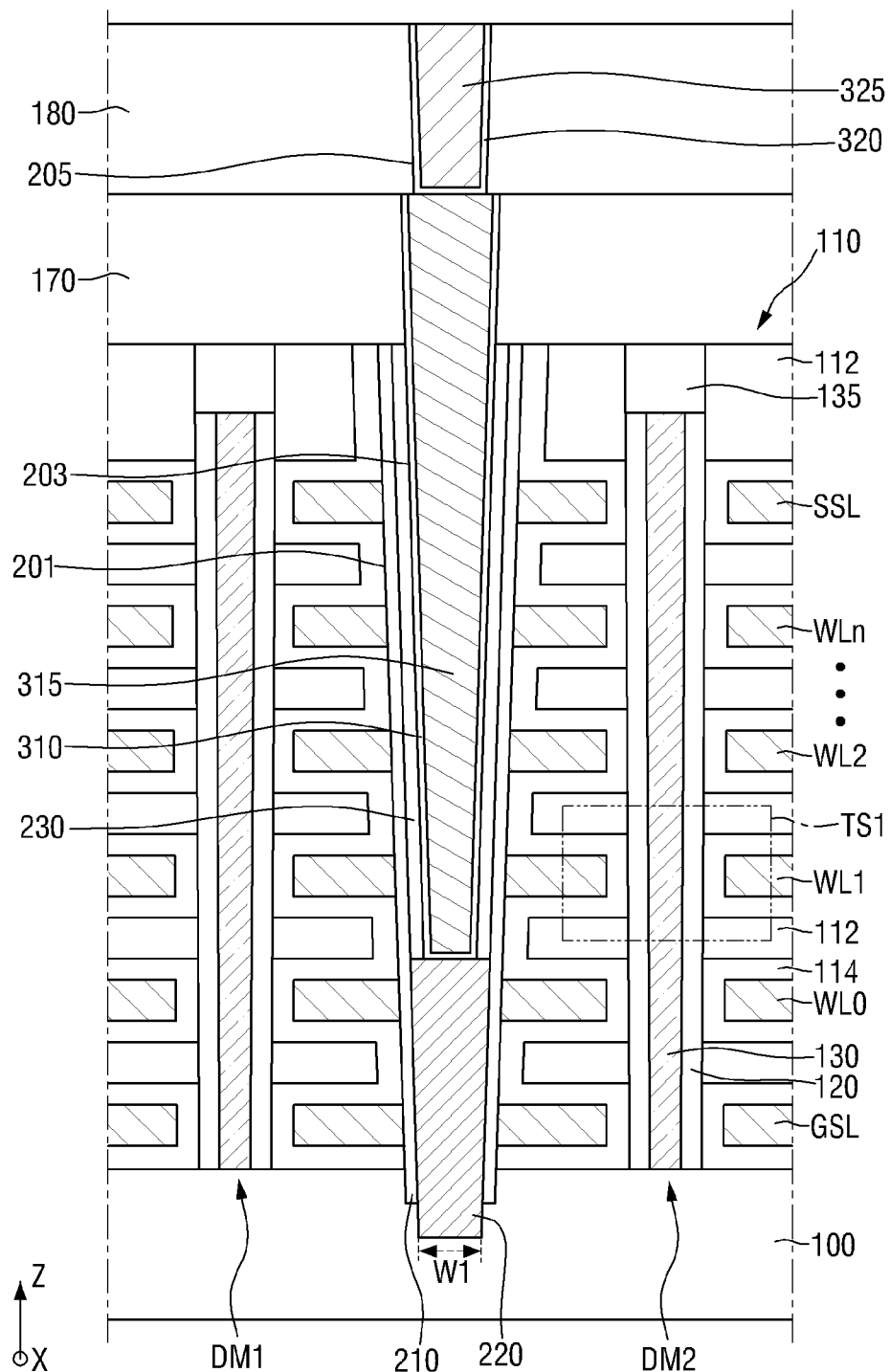
FIG. 3 is a cross-sectional view taken along the line A-A of FIG. 2.
Figure 4:
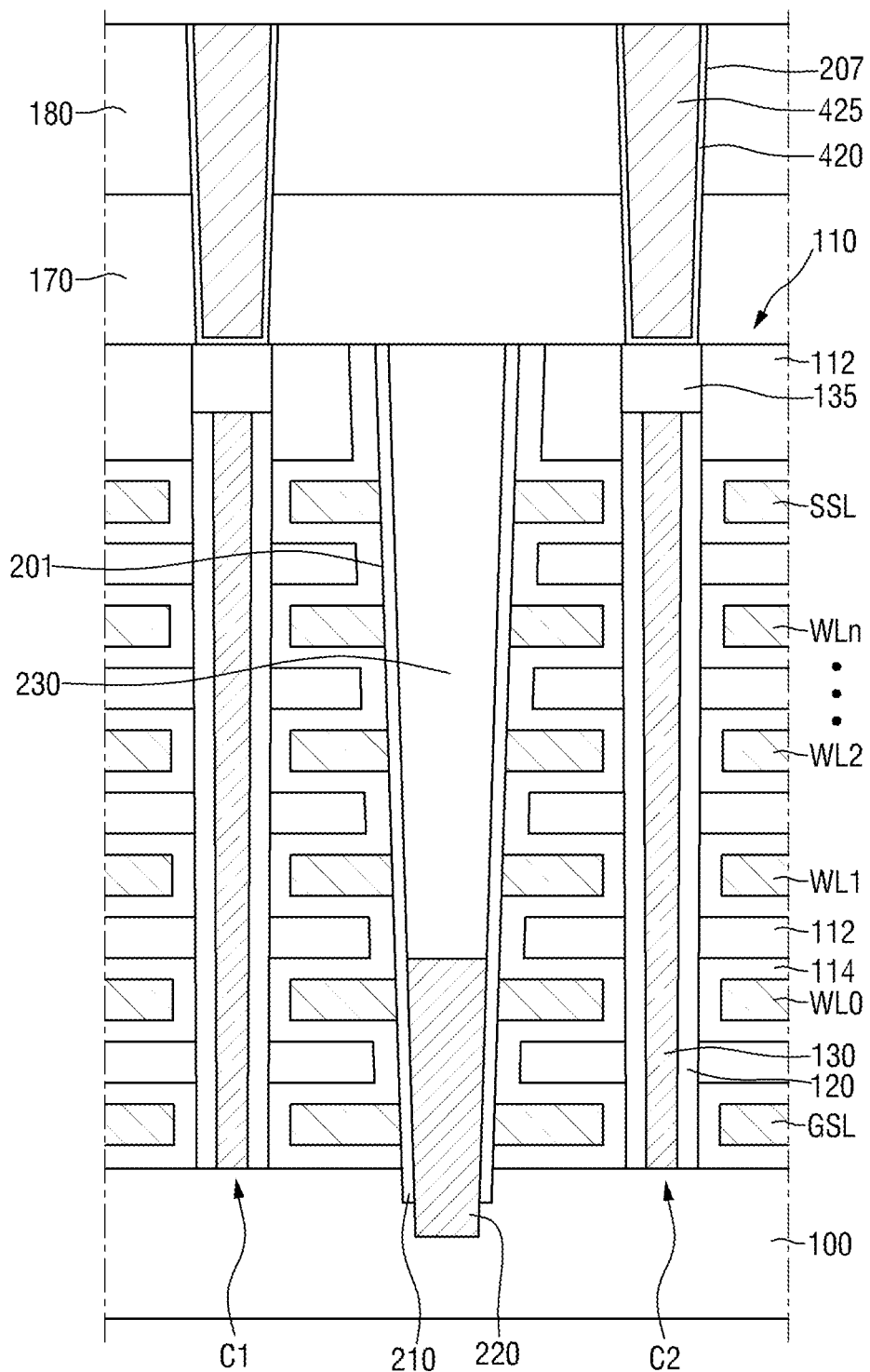
FIG. 4 is a cross-sectional view taken along the line B-B of FIG. 2.
Figure 5:
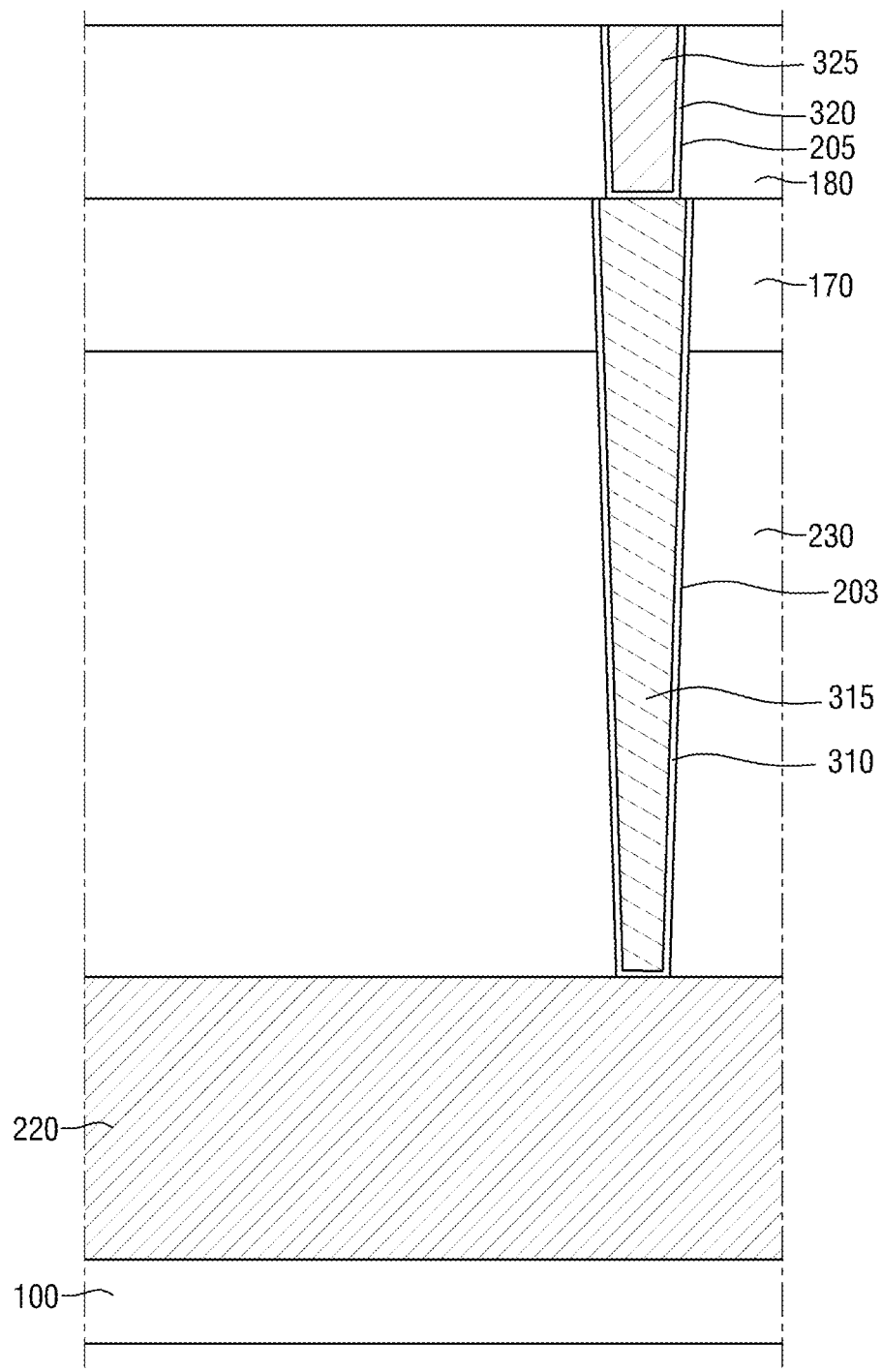
FIG. 5 is a cross-sectional view taken along the line C-C of FIG. 2.
Figure 6:
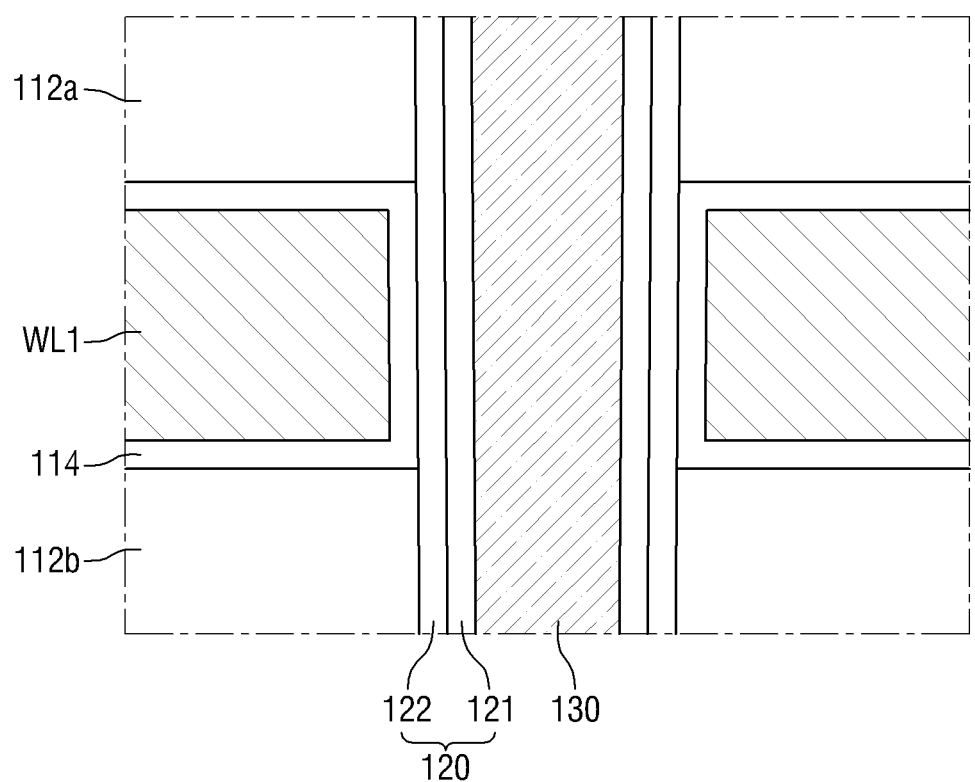
FIG. 6 is an enlarged view of an area TS1 of FIG. 2.

FIG. 1 is a conceptual diagram for explaining a non-volatile memory device according to some embodiments of the present inventive concept. FIG. 2 is a layout diagram for explaining a non-volatile memory device according to an embodiment of the present inventive concept. FIG. 3 is a cross-sectional view taken along the line A-A of FIG. 2. FIG. 4 is a cross-sectional view taken along the line B-B of FIG. 2. FIG. 5 is a cross-sectional view taken along the line C-C of FIG. 2. FIG. 6 is an enlarged view of an area TS1 of FIG. 2.

As shown in FIG. 1, a memory cell array of a non-volatile memory device according to some embodiments of the present inventive concept may include a plurality of memory blocks (BLK1 to BLKn; where n is a natural number).

Each of the memory blocks BLK1 to BLKn may extend in first to third directions (x, y and z). The memory blocks BLK1 to BLKn may be three-dimensionally arranged. As illustrated, the first to third directions (x, y and z) may be directions intersecting with each other or may be directions different from each other. For example, the first to the third directions (x, y and z) may be, but not limited to, directions intersecting with each other at right angles.

As shown in FIGS. 2 to 6, each of the memory blocks (BLKi, where 1≤I≤n, i is a natural number) may include channel structures 120 and 130, an electrode structure 110, a conductive pattern 220, an insulating layer 230, metal contact structures 310 and 315, a first interlayer insulating film 170, a second interlayer insulating film 180, a first conductive stud 325 and a second conductive stud 425 that are formed on a substrate 100.

The substrate 100 may include a semiconductor substrate such as a silicon substrate, a germanium substrate or a silicon-germanium substrate, silicon-on-insulator (SOI) substrate or a germanium-on-insulator (GOI) substrate.

The electrode structure 110 may include a plurality of gate patterns (GSL, WL0 to WLn and SSL) and a plurality of insulation patterns 112 that are located between the channel structures 120 and 130 and the conductive pattern 220 and are alternately laminated. Specifically, the electrode structure 110 may include a plurality of insulation patterns 112, a plurality of gate patterns (GSL, WL0 to WLn and SSL) (where, n is a natural number) and a block layer 114. The gate insulating layer 120 may include a tunnel layer 121 and a trap layer 122.

The plurality of insulation patterns 112 may be sequentially laminated on the substrate 100 to be spaced apart from each other in a direction away from the substrate 100. As illustrated in FIG. 3, each of the plurality of insulation patterns 112 may be formed so as to extend long in a direction parallel to a top surface of the substrate 100. The insulation pattern 112 may be, but not limited to, oxide.

A plurality of gate patterns (GSL, WL0 to WLn and SSL) may be disposed between the plurality of insulation patterns 112. The plurality of gate patterns (GSL, WL0 to WLn and SSL) is formed long in a direction parallel to the top surface of the substrate 100, and may be laminated in a direction away from the substrate 100.

In some exemplary implementations of the herein described subject matter the lowest gate pattern GSL may be provided as a ground selection line (hereinafter, referred to as GSL), and the highest gate pattern SSL may be provided as a string selection line (hereinafter, referred to as SSL). The gate patterns (WL0 to WLn) between the GSL and the SSL may be provided as word lines.

A plurality of gate patterns (GSL, WL0 to WL and SSL) may be formed of a conductive material, for example, a conductive material such as tungsten (W), cobalt (Co) and nickel (Ni) or a semiconductor material such as silicon, but are not limited thereto.

The block layer 114 may be disposed between the channel structures 120 and 130 and the plurality of gate patterns (GSL, WL0 to WLn and SSL). The block layer 114 may be formed to extend long in the direction away from the substrate 100. The block layer 114 may be formed in a direction parallel to the substrate 100 in a zigzag form.

At this time, a non-volatile memory cell TS1 may be defined in a region in which the channel structures 120 and 130 intersect with the plurality of gate patterns (GSL, WL0 to WLn and SSL). Details of the non-volatile memory cell TS1 will be described below referring to FIGS. 6 to 8.

The channel structures 120 and 130 are formed to extend long in the direction away from the substrate 100. Specifically, the channel structures 120 and 130 are disposed on the substrate 100 in the form of a pillar and are formed to penetrate through the plurality of laminated insulation patterns 112. Each of the plurality of gate patterns (GSL, WL0 to WLn and SSL) may be formed between the plurality of laminated insulation patterns 112. The plurality of gate patterns (GSL, WL0 to WLn and SSL) may be formed to intersect with the channel structures 120 and 130. Although the plurality of gate patterns (GSL, WL0 to WLn and SSL) has been described to have the same thickness, the present inventive concept is not limited thereto, and the plurality of gate patterns may also have thicknesses different from each other.

The channel structures 120 and 130 may include a channel pattern 130 and a gate insulating layer 120.

The channel pattern 130 may be formed to extend perpendicularly to the substrate 100. The channel pattern 130, for example, may be a semiconductor material such as single crystal silicon, but it is not limited thereto. Although it is not clearly illustrated in the drawings, the channel pattern 130 may have a hollow cylindrical shape, a cup shape, a hollow rectangular parallelepiped shape, a solid pillar shape or the like.

The gate insulating layer 120 may be formed to wrap the side surfaces of the channel pattern 130. The gate insulating layer 120 may be conformally formed in a lengthwise direction of the channel pattern 130. The top surface of the channel pattern 130 and the top surface of the gate insulating layer 120 may be located on the same plane.

The gate insulating layer 120 may include a tunnel layer 121 and a trap layer 122. That is, the tunnel layer 121 and the trap layer 122 may be disposed along the lengthwise direction of the channel patterns 130. The tunnel layer 121 and the trap layer 122 may be disposed between the plurality of gate patterns (GSL, WL0 to WLn and SSL) and the channel pattern 130. Specifically, for example, the tunnel layer 121 and the trap layer 122 may be formed along the channel pattern 130 to penetrate through the plurality of insulation patterns 112.

The tunnel layer 121 is a portion through which electric charge passes, and for example, may be formed by a silicon oxide film or a double layer of the silicon oxide film and a silicon nitride film.

The trap layer 122 is a portion in which the electric charge after passing through the tunnel layer 121 is stored. For example, the trap layer 122 may be formed of a nitride film or a high dielectric constant (high-k) film. The nitride film, for example, may contain one or more of silicon nitride, silicon oxynitride, hafnium oxynitride, zirconium oxynitride, hafnium silicon oxynitride or hafnium aluminum oxynitride. The high dielectric constant film, for example, may contain one or more of hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide or lead zinc niobate.

As shown in FIG. 6, the block layer 114 may be disposed between an insulation pattern (112a in FIG. 6) disposed on the upper side and the gate pattern (WL1 in FIG. 6), between an insulation pattern (112b in FIG. 6) disposed on the lower side and the gate pattern WL1, and between the channel pattern 130 (or the trap layer 122) and the electrode WL1. The block layer 114 may be conformally formed depending on the shapes of the insulation patterns 112a and 112b and the channel pattern 130.

The block layer 114 may be a single layer or multiple layers. The block layer 114 may include silicon oxide or insulating metal oxide having a dielectric constant greater than silicon oxide. For example, the block layer may be formed of a composite layer that is laminated by a high-dielectric constant material such as aluminum oxide, hafnium oxide, lanthanum oxide, tantalum oxide, titanium oxide, lanthanum hafnium oxide, lanthanum aluminum oxide or dysprosium scandium oxide, or combinations thereof. A case where there is a single block layer 114 is illustrated in the drawings, but it is not limited thereto. For example, the block layer 114, for example, may be a laminate of silicon oxide and aluminum oxide.

Meanwhile, the configurations of the tunnel layer 121, the trap layer 122 and the block layer 114 illustrated in FIG. 6 are merely an example. For example, the tunnel layer 121, the trap layer 122 and the block layer 114 may be disposed along the lengthwise direction of the channel pattern 130. This will be described below in detail with reference to FIGS. 7 and 8.

A channel pad 135 may be formed on the channel structures 120 and 130. A bottom surface of the channel pad 135 may be in contact with the top surfaces of the channel structures 120 and 130. The channel pad 135, for example, may contain polysilicon doped with impurities.

The top surface of the channel pad 135 may be disposed on the same plane as the top surface of the electrode structure 110. At this time, a highest surface of the gate insulating layer 120 and a highest surface of the block layer 114 may be disposed on the same plane as the top surface of the channel pad 135. However, the present inventive concept is not limited thereto.

The conductive pattern 220 may be disposed on the substrate 100 to extend perpendicularly to the substrate 100 and to be spaced apart from the channel structures 120 and 130. In this example, the conductive pattern 220 is in contact with the substrate 100 and is embedded in a trench formed in the substrate 100. The conductive pattern 220 may operate as a common source line (CSL).

The conductive pattern 220 may be located within the first trench 201 which penetrates through the electrode structure 110. The conductive pattern 220 may be disposed between different electrode structures 110. The top surface of the conductive pattern 220 may be formed to be higher than the top surface of the substrate 100 and to be lower than the top surfaces of the channel structures 120 and 130.

The top surface of the conductive pattern 220 may be formed to be lower than one surface of the plurality of gate patterns. Specifically, when the electrode structure 110 includes first to n-th gate patterns (WL0 to WLn) that are sequentially laminated in a direction away from the substrate 100, the top surface of the conductive pattern 220 may be disposed between the k-th gate pattern and the k+1st gate pattern (k is a natural number smaller than n).

For example, as shown in FIG. 3, the top surface of the conductive pattern 220 may be higher than the top surface of the first gate pattern WL0 and may be lower than the top surface of the second gate pattern WL1. However, the present inventive concept is not limited thereto, and the top surface of the conductive pattern 220 may be freely adjusted within a range between the top surface of the substrate 100 and the top surfaces of the channel structure 120 and 130. For example, the top surface of the conductive pattern 220 may be higher than the top surface of the ground selection line GSL but lower than the top surface of the first gate pattern WL0.

The conductive pattern 220 may include a metallic material or a metallic compound. For example, the conductive pattern 220 may contain tungsten (W). However, the present inventive concept is not limited thereto, and for example, may contain at least one of polysilicon, a metal silicide compound, a conductive metal nitride and metals.

The insulating layer 230 may be formed on the conductive pattern 220 within the first trench 201. The insulating layer 230 is in contact with the top surface of the conductive pattern 220 and may be formed along the side surfaces of the electrode structure 110. The top surface of the insulating layer 230 may be located on the same plane as the top surface of the channel pad 135 or the top surface of the electrode structure 110. The insulating layer 230 may be formed of a material having a dielectric constant. In some embodiments of the present inventive concept, the insulating layer 230, for example, may be made of a material such as HfO2, Al2O3, ZrO2 and TaO2, but the present inventive concept is not limited thereto.

The spacer 210 is disposed between the conductive pattern 220 and the electrode structure 110 and between the insulating layer 230 and the electrode structure 110. A spacer 210 may be formed along the side surfaces of the conductive pattern 220 and the side surfaces of the insulating layer 230. The spacer 210 may be formed to wrap the conductive pattern 220 and the insulating layer 230. The spacer 210 may be conformally formed along the side surfaces of the electrode structure 110. The top surface of the spacer 210 may be located on the same plane as the top surface of the channel pad 135, the top surface of the electrode structure 110 or the top surface of the insulating layer 230. The spacer 210 includes at least one insulating material, e.g., silicon oxide.

The spacer 210 may be formed along the side walls of the first trench 201. The bottom surface of the spacer 210 may be formed to be lower than the top surface of the substrate 100. However, the bottom surface of the spacer 210 may be formed to be higher than the bottom surface of the conductive pattern 220.

A first interlayer insulating film 170 may be formed to cover the channel structures 120 and 130, the channel pad 135, the electrode structure 110 and the insulating layer 230. The first interlayer insulating film 170 may take charge of the electrical insulation between semiconductor devices located below the first interlayer insulating film 170 and semiconductor elements located above the first interlayer insulating film 170.

The first interlayer insulating film 170 may be formed, using silicon oxide such as borosilicate glass (BSG), phosphosilicate glass (PSG), borophosphosilicate glass (BPSG), undoped silicate glass (USG), tetraethylorthosilicate glass (TEOS) or a high-density plasma-CVD (HDP-CVD).

The metal contact structures 310 and 315 may be formed to come into contact with the top surface of the conductive pattern 220 through the first interlayer insulating film 170 and the insulating layer 230. The metal contact structures 310 and 315 may include a metal contact 315 and a first barrier metal 310.

The first barrier metal 310 may be formed along the side surface of the insulating layer 230 and the top surface of the conductive pattern 220. The first barrier metal 310 may be conformally formed on the inner surface of the second trench 203. That is, the first barrier metal 310 may be formed on both side surfaces and the bottom surface of the second trench 203 with a constant thickness. Otherwise, although it is not clearly illustrated in the drawings, the first barrier metal 310 may also be formed only on the bottom surface of the second trench 203 with a constant thickness. The first barrier metal 310 may contain titanium (Ti), titanium nitride (TiN) or tungsten nitride (WN). The first barrier metal 310 may be formed using PVD, CVD or ILD methods. However, the present inventive concept is not limited thereto.

The metal contact 315 may be formed on the first barrier metal 310. The metal contact 315 may be formed to embed the second trench 203. The metal contact 315 may be electrically connected to the conductive pattern 220. The metal contact 315 may include a metallic material or a metallic compound. For example, the metal contact 315 may contain tungsten (W). However, the present inventive concept is not limited thereto, and for example, may contain at least one of polysilicon, a metal silicide compound, a conductive metal nitride and metals.

The bottom surfaces of the metal contact structures 310 and 315 may be formed to be lower than the top surfaces of the channel structures 120 and 130. The reason is that the top surface of the conductive pattern 220 and the bottom surfaces of the metal contact structure 310 and 315 are disposed on the same plane. The metal contact 315 may be formed together in a process of forming the metal contact 315 included in a PERI region around the memory block. However, the present inventive concept is not limited thereto.

The second interlayer insulating film 180 may be formed to cover the first interlayer insulating film 170. The second interlayer insulating film 180 may take charge of the electrical insulation between the semiconductor elements located below the second interlayer insulating film 180 and the semiconductor elements located above the second interlayer insulating film 180. The second interlayer insulating film 180 may include the same material as the first interlayer insulating film 170, but the present inventive concept is not limited thereto.

A first conductive stud 325 may be formed on the metal contact structures 310 and 315. The first conductive stud 325 may be formed in a third trench 205. At this time, the third trench 205 may be formed to partially expose the metal contact structures 310 and 315. Thus, the first conductive stud 325 may be formed to penetrate through the second interlayer insulating film 180. The first conductive stud 325 may contain tungsten (W). However, the present inventive concept is not limited thereto, and may contain, for example, at least one of polysilicon, a metal silicide compound, a conductive metal nitride and metals.

A second barrier metal 320 may be formed between the first conductive stud 325 and the third trench 205. The second barrier metal 320 may be conformally formed on the inner surface of the third trench. That is, the second barrier metal 320 may be formed on both side surfaces and the bottom surface of the third trench 205 with a constant thickness. Otherwise, although it is not clearly illustrated in the drawings, the second barrier metal 320 may be formed only on the bottom surface of the third trench at a certain thickness. The second barrier metal 320 may contain titanium (Ti), titanium nitride (TiN) or tungsten nitride (WN). The second barrier metal 320 may be formed using PVD, CVD or ILD methods. However, the present inventive concept is not limited thereto.

The channel structures 120 and 130 illustrated in FIG. 3 may be dummy channel structures DM1 and DM2. The conductive stud is not disposed on the top surfaces of the dummy channel structures DM1, DM2. Thus, the dummy channel structures DM1 and DM2 do not operate as a channel.

Meanwhile, the channel structures 120 and 130 illustrated in FIG. 4 may be active channel structures C1 and C2. A second conductive stud 425 and a third barrier metal 420 may be formed on the active channel structures C1 and C2. Although it is not clearly illustrated in the drawings, the second conductive stud 425 may electrically connect the active-channel structures C1 and C2 and the other node through the wirings.

The second conductive stud 425 may be formed on the active channel structures C1 and C2. However, the second conductive stud 425 may not be formed on the dummy channel structures DM1 and DM2.

The second conductive stud 425 may be formed in the fourth trench 207. At this time, a fourth trench 207 may be formed to expose a part of the active channel structures C1 and C2. Thus, the second conductive stud 425 may be formed to penetrate through the first interlayer insulating film 170 and the second interlayer insulating film 180. The second conductive stud 425 may be made of the same material as the first conductive stud 325. That is, the first conductive stud 325 and the second conductive stud 425 may be formed through the same process. However, the present inventive concept is not limited thereto.

A third barrier metal 420 may be formed between the second conductive stud 425 and the fourth trench 207. The third barrier metal 420 may be conformally formed on the inner surface of the fourth trench. That is, the third barrier metal 420 may be formed on both side surfaces and the bottom surface of the fourth trench 207 with a constant thickness. Otherwise, although it is not clearly illustrated in the drawings, the third barrier metal 420 may be formed only on the bottom surface of the fourth trench with a constant thickness. The third barrier metal 420 may be made of the same material as the second barrier metal 320. That is, the second barrier metal 320 and the third barrier metal 420 may be formed through the same process. However, the present inventive concept is not limited thereto.

As shown in FIGS. 2, 4 and 5, the metal contact structures 310 and 315 may be located closest to dummy channel structures DM1 and DM2 of the plurality of channel structures 120 and 130. That is, a distance between the metal contact structures 310 and 315 and the dummy channel structures DM1 and DM2 (e.g., DM1) may be smaller than a distance between the metal contact structures 310 and 315 and the active channel structures C1 and C2 (e.g., C3). In other words, the channel structures 120 and 130 close to the metal contact structures 310 and 315 may be used as dummy channel structures DM1 and DM2. However, the present inventive concept is not limited thereto.

A plurality of channel structures 120 and 130 may be disposed in a honeycomb shape. That is, a plurality of adjacent channel structures 120 and 130 may be continuously arranged in a hexagonal shape.

When the plurality of channel structures 120 and 130 includes first to fourth channel structures (C3, C1, C4 and DM1), the first channel structure C3 may be disposed to be located at the same distance L1 as the second to fourth channel structures (C1, C4 and DM1).

The conductive pattern 220 may extend long in a direction parallel to the substrate 100 on the X-Y plane, and the plurality of channel structures 120 and 130 may be symmetrically disposed about the conductive pattern 220.

In the case of the related art, the top surface of the conductive pattern is formed to be the same as or higher than the top surface of the channel structure. Accordingly, the conductive pattern is formed vertically long and is also formed long on the left and right sides in a line pattern. A phenomenon in which an F-gas is concentrated in one place through the slit area within the conductive pattern frequently occurs in this process, and a case where HF generated in this process etches tungsten (W) or ONO occurs. This acts as a factor of increasing a failure rate of the non-volatile memory device. Further, the line type conductive pattern also acts as a factor of increasing the stress.

Thus, according to the present exemplary implementations of the disclosed subject matter, the slit area and the F-gas are removed by partially removing the top of the conductive pattern after generating the conductive pattern. That is, the top of the conductive pattern is etched so that the height of the conductive pattern is lower than the top surface of the channel structure. Also, a metal contact structure that takes charge of the electrical connection between the conductive stud and the conductive pattern is added.

Some exemplary implementations can remove the slit area of the conductive pattern formed by the F-gas and reduce the stress applied by the conductive pattern. Thus, the exemplary implementations have the effect of reducing the failure rate of the non-volatile memory device and improving the performance.

Figure 7:
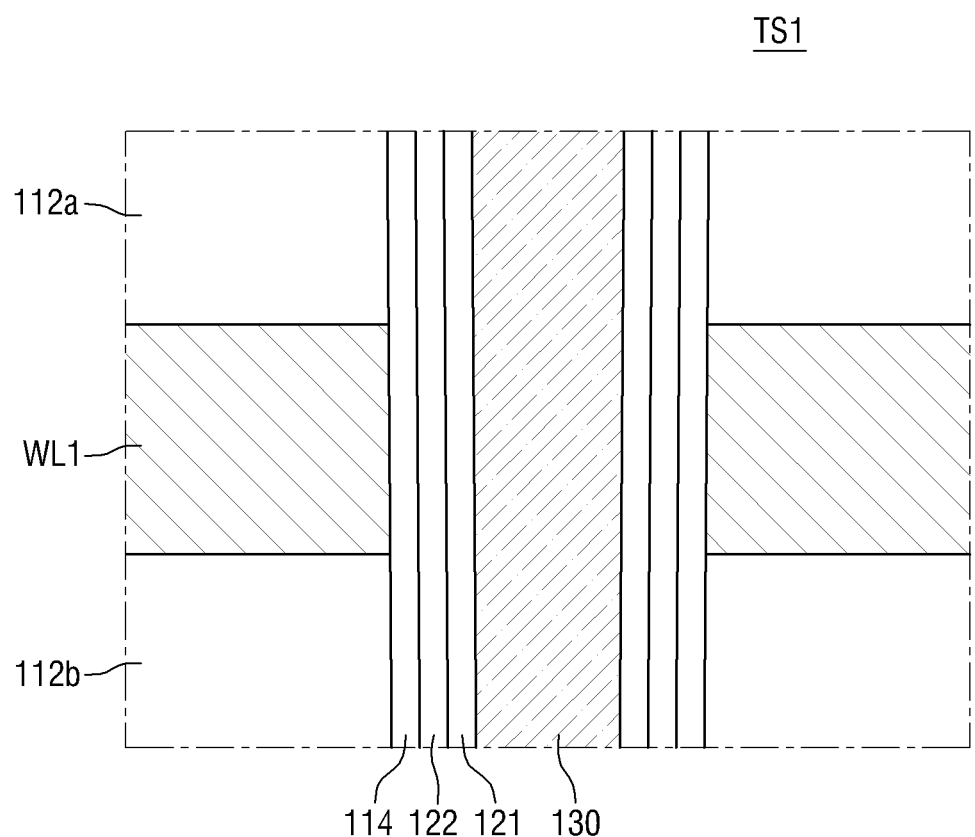
FIGS. 7 and 8 are cross-sectional views for explaining some application examples of the non-volatile memory device according to some exemplary implementations.
Figure 8:
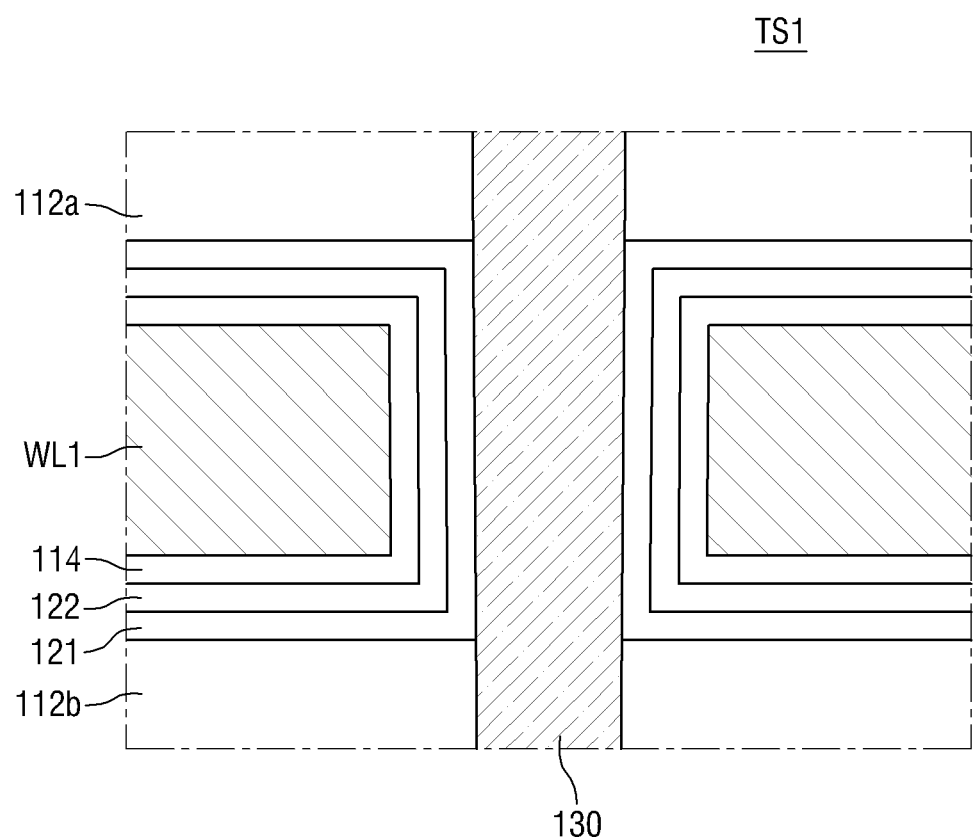

FIGS. 7 and 8 are cross-sectional views for explaining some application examples of the non-volatile memory device according to exemplary implementations. FIGS. 7 and 8 may provide other examples to be used in place of the non-volatile memory cell TS1 illustrated in FIG. 6. For convenience of description, differences from the description of FIG. 6 will be mainly described.

As shown in FIG. 7, in the application example of the non-volatile memory device according to some exemplary implementations, a tunnel layer 121, a trap layer 122 and a block layer 114 may be formed on the side walls of the channel pattern 130. The tunnel layer 121, the trap layer 122 and the block layer 114 may be disposed along the lengthwise direction of the channel pattern 130. More specifically, the tunnel layer 121, the trap layer 122 and the block layer 114 may be formed along the channel pattern 130 to penetrate through the plurality of insulation patterns 112.

Further, as shown in FIG. 8, in some application examples of the non-volatile memory device according to some exemplary implementations, the tunnel layer 121, the trap layer 122 and the block layer 114 may be disposed between the insulation pattern (112a in FIG. 8) disposed on the upper side and the gate pattern (WL1 in FIG. 8), between the insulation pattern (112b in FIG. 8) disposed on the lower side and the gate pattern WL1, and between the channel pattern 130 and the pattern WL1. That is, the tunnel layer 121, the trap layer 122 and the block layer 114 may be conformally formed depending on the shapes of the insulation patterns 112a and 112b and the channel pattern 130. However, the present inventive concept is not limited thereto.

Figure 9:
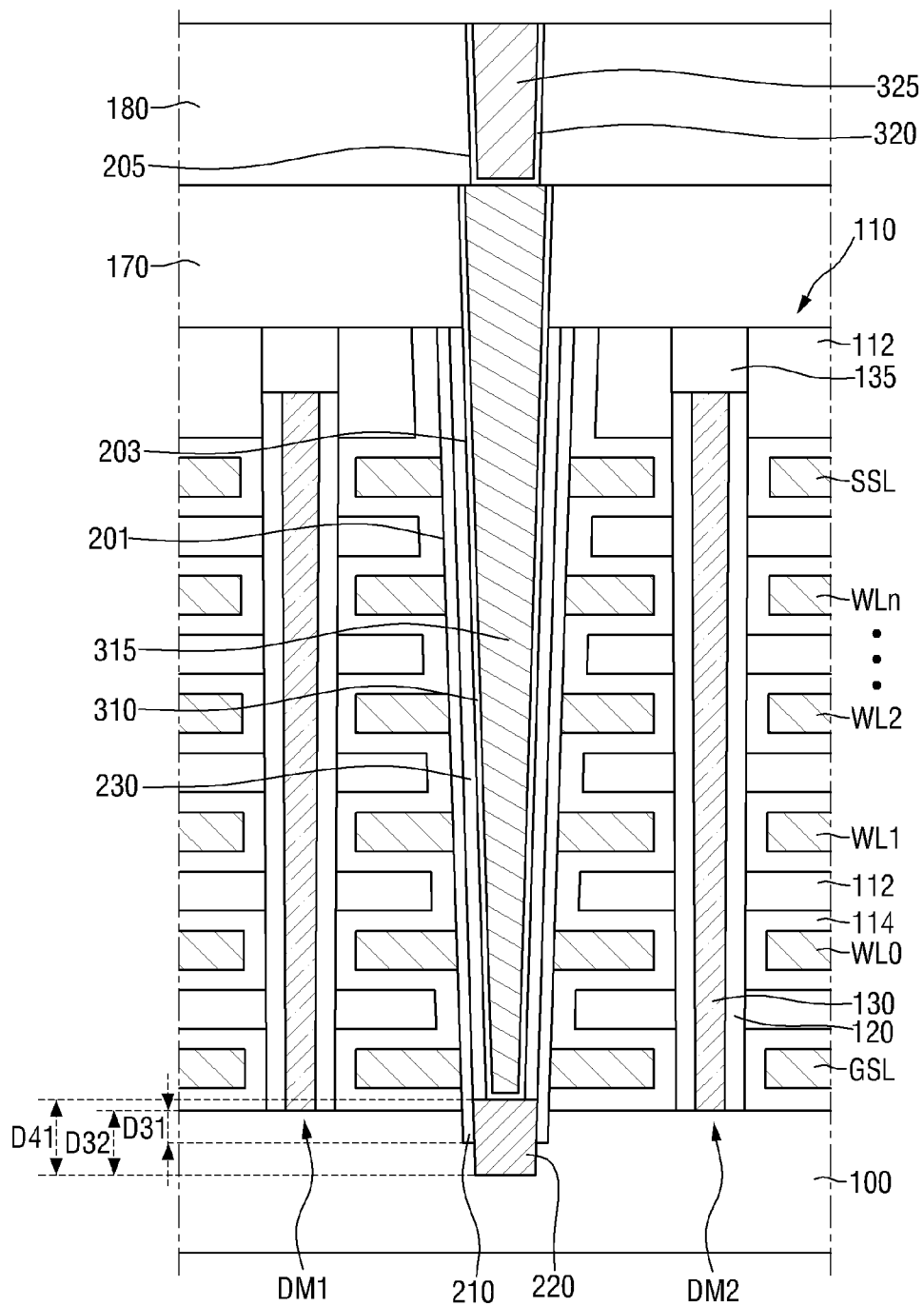
FIG. 9 is a cross-sectional view for illustrating a non-volatile memory device according to some exemplary implementations.
Figure 10:
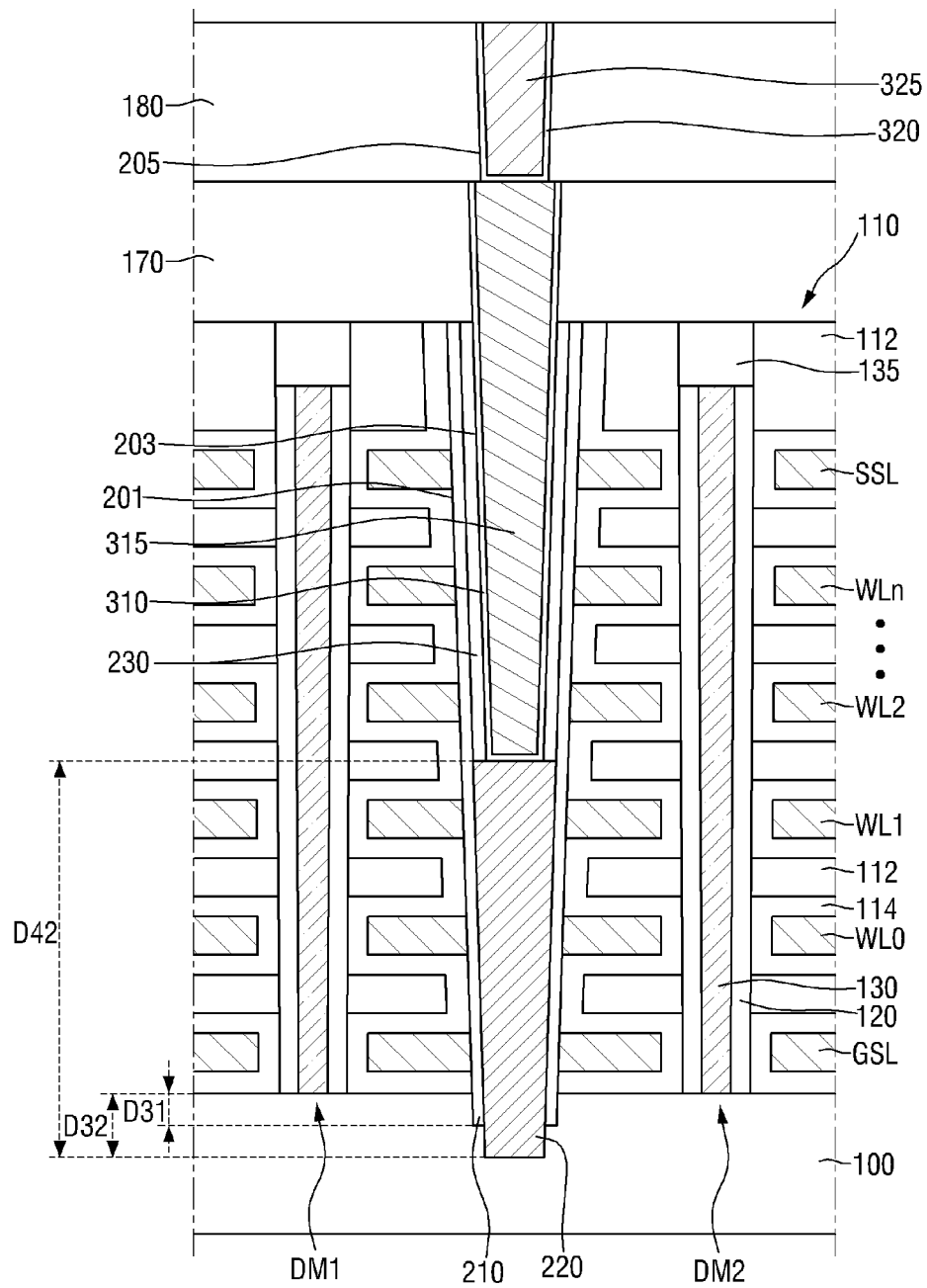
FIG. 10 is a cross-sectional view for illustrating a non-volatile memory device according to some exemplary implementations.

FIG. 9 is a cross-sectional view for illustrating a non-volatile memory device according to some exemplary implementations. FIG. 10 is a cross-sectional view for illustrating a non-volatile memory device according to some exemplary implementations. For convenience of description, hereinafter, the repeated description of the same matters as in the above-described example will be omitted, and the differences will be mainly described.

As shown in FIGS. 9 and 10, non-volatile memory devices 2a and 2b according to some exemplary implementations may be configured and operated substantially in the same manner as the non-volatile memory device 1 described with reference to FIGS. 1 to 8.

However, the height of the top surface of the conductive pattern 220 and the height of the bottom surface of the metal contact structures 310 and 315 may vary. Since the top surface of the conductive pattern 220 and the bottom surfaces of the metal contact structures 310 and 315 are disposed on the same plane, the description will be provided based on the top surface of the conductive pattern 220.

The top surface of the conductive pattern 220 is higher than the top surface of the substrate 100, and may vary within a range lower than the top surface of the channel structures 120 and 130.

For example, as shown in FIG. 9, the top surface of the conductive pattern 220 is higher than the top surface of the substrate 100, and may be located below the gate pattern included in the electrode structure 110. That is, a height D41 of the conductive pattern 220 may be larger than a height D32 between the top surface of the substrate 100 and the bottom surface of the conductive pattern 220.

As still another example, as shown in FIG. 10, when the electrode structure 110 includes first to n-th gate patterns (WL0 to WLn) that are sequentially laminated in a direction away from the substrate 100, the top surface of the conductive pattern 220 may be disposed between the k-th gate pattern and k+1st gate pattern (k is a natural number smaller than n). For example, the top surface of the conductive pattern 220 may be higher than the top surface of the second gate pattern WL1 and may be lower than the top surface of the third gate pattern WL2. As a result, the height D42 of the conductive pattern 220 may be larger than the height D32 between the top surface of the substrate 100 and the bottom surface of the conductive pattern 220.

Further, the top surface of the conductive pattern 220 may be formed to overlap the second gate pattern WL1 to be lower than the top surface of the second gate pattern WL1 and higher than the bottom surface of the second gate pattern WL1. However, the present inventive concept is not limited thereto.

The bottom surface of the spacer 210 may be formed to be higher than the bottom surface of the conductive pattern 220. That is, a spacer may be present between the bottom surface of the spacer 210 and the bottom surface of the conductive pattern 220. For example, on the basis of the top surface of the substrate 100, a depth D31 to the bottom surface of the spacer 210 may be smaller than a depth D32 to the bottom surface of the conductive pattern 220.

Figure 11:
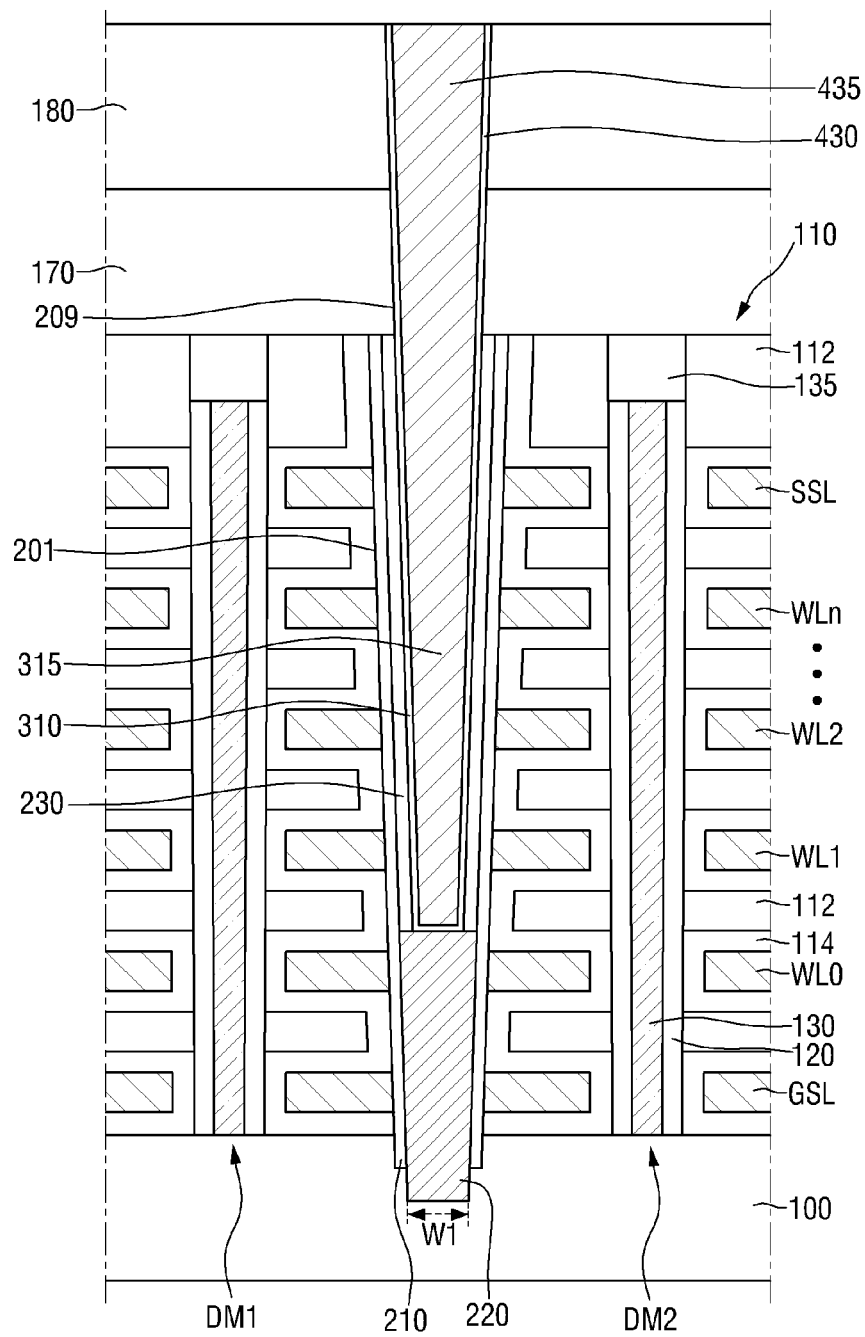
FIG. 11 is a cross-sectional view for illustrating the non-volatile memory device according to some exemplary implementations.

FIG. 11 is a cross-sectional view for illustrating the non-volatile memory device according to some exemplary implementations. For convenience of description, hereinafter, the repeated description of the same matters as in the above-described example will be omitted, and the differences will be mainly described.

As shown in FIG. 11, a non-volatile memory device 3 according to some embodiments of the present inventive concept may be configured and operated substantially in the same manner as the non-volatile memory device 1 described with reference to FIGS. 1 to 8.

However, the first conductive stud 325 and the metal contact 315 of the metal contact structures 310 and 315 may be integrally formed. Accordingly, the third conductive stud 435 may be electrically connected to the conductive pattern 220 through the first interlayer insulating film 170 and the second interlayer insulating film 180.

Specifically, a fifth trench 209 may be formed through the first interlayer insulating film 170 and the second interlayer insulating film 180 so as to expose a part of the top surface of the conductive pattern 220.

The fourth barrier metal 430 may be conformally formed on the inner surface of the fourth trench. That is, the fourth barrier metal 430 may be formed along the side surfaces of the insulating layer 230, the top surface of the conductive pattern 220, the side surfaces of the first interlayer insulating film 170 and the side surfaces of the second interlayer insulating film 180. The fourth barrier metal 430 may be formed on both side surfaces and the bottom surface of the fifth trench 209 with a constant thickness. The fourth barrier metal 430 includes the same material as the third barrier metal 420 and may be formed in the same process.

The third conductive stud 435 may be formed on the fourth barrier metal 430. The third conductive stud 435 may be formed to embed the fifth trench 209. The third conductive stud 435 may be electrically connected to the conductive pattern 220. The third conductive stud 435 includes the same material as the second conductive studs 425 and may be formed in the same process. However, the present inventive concept is not limited thereto.

Figure 12:
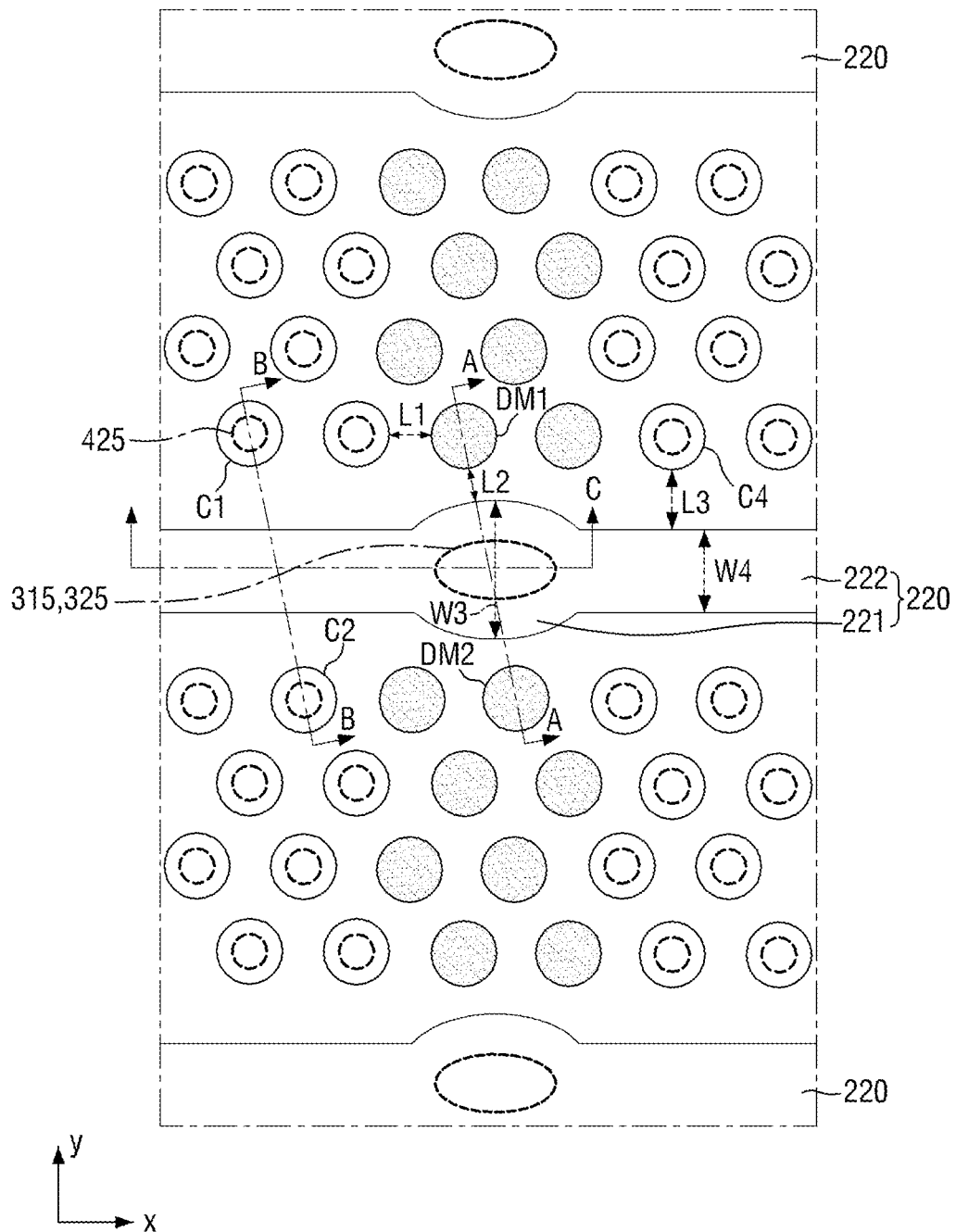
FIG. 12 is a layout diagram for explaining a non-volatile memory device according to some exemplary implementations.
Figure 13:
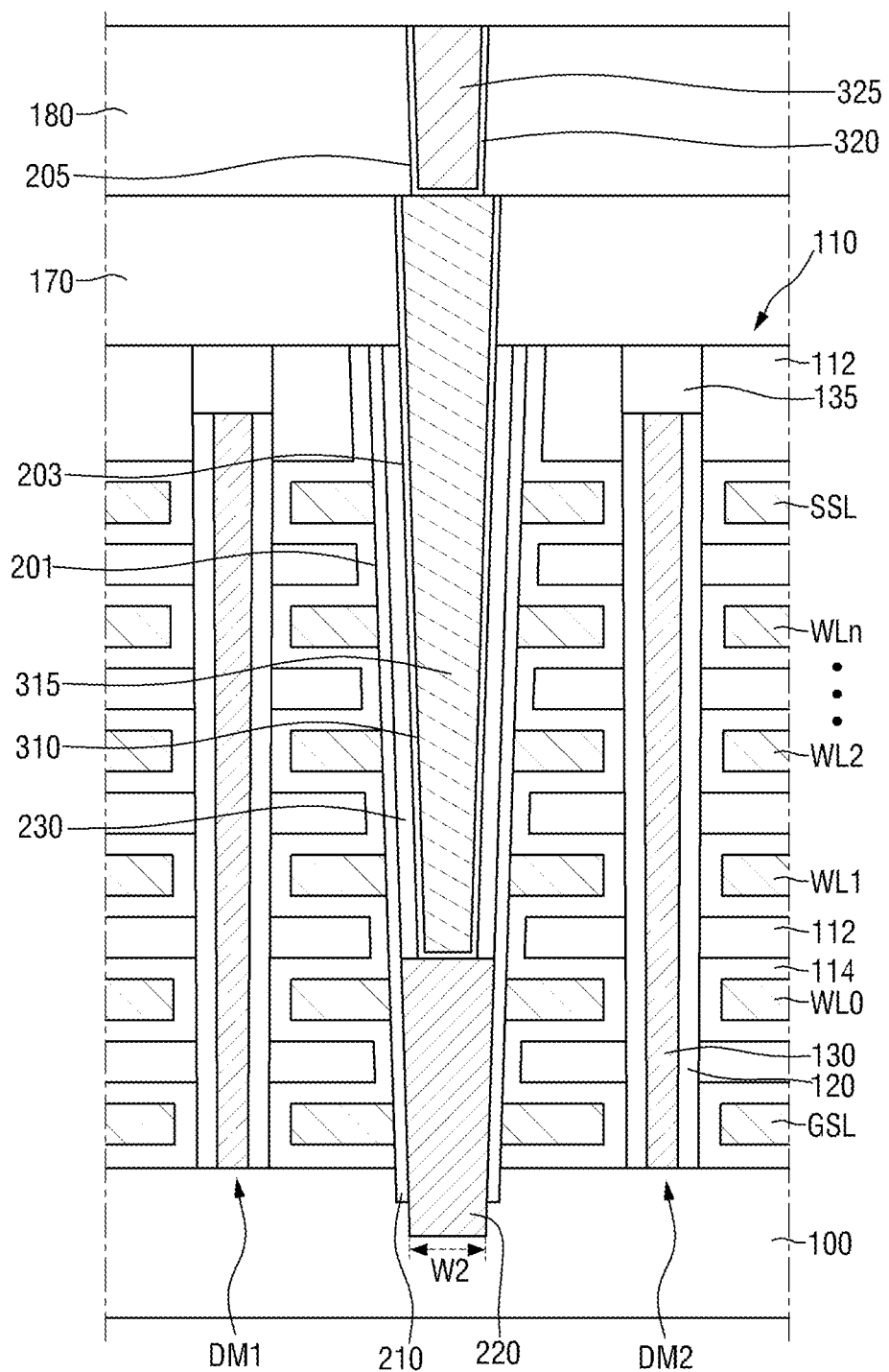
FIG. 13 is a cross-sectional view taken along the line A-A in FIG. 12.

FIG. 12 is a layout diagram for explaining a non-volatile memory device according to some exemplary implementations. FIG. 13 is a cross-sectional view taken along the line A-A in FIG. 12. For convenience of description, hereinafter, the repeated description of the same matters as in the above-described example will be omitted, and the differences will be mainly described.

As shown in FIG. 12, a non-volatile memory device 4 according to some exemplary implementations may be configured and operated substantially in the same manner as the non-volatile memory device 1 described with reference to FIGS. 1 to 8. Thus, each of the cross-sections taken along the line B-B and the line C-C may be the same as those of FIGS. 4 and 5.

However, the conductive pattern 220 may include a first portion 221 including the metal contact 315, and a second portion 222 adjacent to the first portion 221. The second portion 222 may correspond to both side surfaces of the first portion 221. At this time, a width W3 of the first portion 221 measured in a first direction parallel to the top surface of the substrate 100 may be formed to be larger than a width W4 of the second portion 222 measured in the first direction. That is, the first portion 221 may be convexly formed in the X-Y plane and may be formed to have a thickness different from the second portion 222 adjacent to the first portion 221.

Thus, a distance L2 between the channel structure (e.g., DM1) closest to the first portion 221 and the first portion 221 may be smaller than a distance L3 between the channel structure (e.g., C4) closest to the second portion 222 and the second portion 222. However, the present inventive concept is not limited thereto.

Thus, as shown in FIG. 13, the width W2 of the bottom surface of the conductive pattern 220 may be formed to be larger than the width W1 of the bottom surface of the conductive pattern 220 illustrated in FIG. 3. Further, the width of the insulating layer 230 between the spacer 210 and the metal contact structures 310 and 315 and the widths of the metal contact structures 310 and 315 may also be formed to be larger than those of the non-volatile memory device illustrated in FIG. 3. However, the present inventive concept is not limited thereto.

Figure 14:
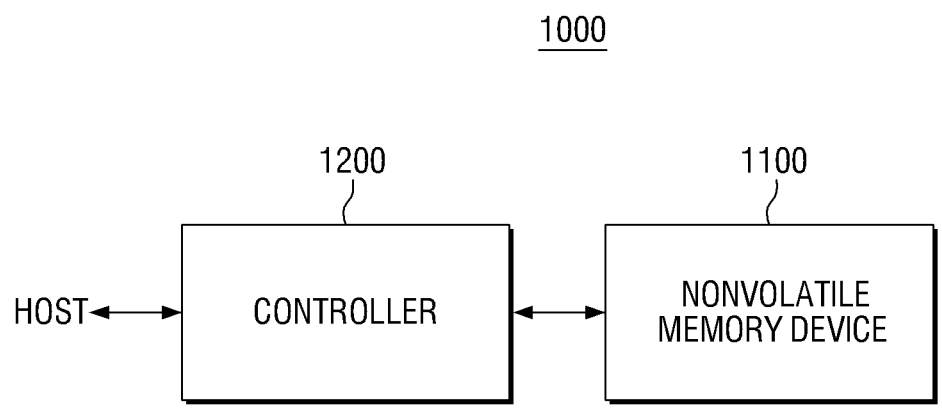
FIG. 14 is a block diagram for illustrating a memory system according to some exemplary implementations.

FIG. 14 is a block diagram for illustrating a memory system according to some embodiments of the present inventive concept.

As shown in FIG. 14, a memory system 1000 includes a non-volatile memory device 1100 and a controller 1200.

The non-volatile memory device 1100 may be at least one of the non-volatile memory device according to some exemplary implementations described with reference to FIGS. 1 to 13.

The controller 1200 is connected to a host and a non-volatile memory device 1100. The controller 1200 is configured to access the non-volatile memory device 1100 in response to a request from a host. For example, the controller 1200 is configured to control the operations of read, write, erase and background of the non-volatile memory device 1100. The controller 1200 is configured to provide an interface between the non-volatile memory device 1100 and the host. The controller 1200 is configured to drive a firmware for controlling the non-volatile memory device 1100.

As an example, the controller 1200 further includes well-known constituent elements such as a random access memory (RAM), a processing unit, a host interface and a memory interface. The RAM is used as at least as one of an operating memory of the processing unit, a cache memory between the non-volatile memory device 1100 and the host, and a buffer memory between the non-volatile memory device 1100 and the host. The processing unit controls various operations of the controller 1200.

The host interface includes a protocol for performing a data exchange between the host and the controller 1200. As an example, the controller 1200 is configured to communicate with outside (host) through at least one of various interface protocols, such as a universal serial bus (USB) protocol, a multimedia card (MMC) protocol, a peripheral component interconnection (PCI) protocol, a PCI-express (PCI-E) protocol, an advanced technology attachment (ATA) protocol, a serial-ATA protocol, a parallel-ATA protocol, a small computer small interface (SCSI) protocol, an enhanced small disk interface (ESDI) protocol and an integrated drive electronic (IDE) protocol. The memory interface interfaces with the non-volatile memory device 1100. For example, the memory interface includes a NAND interface or a NOR interface.

The memory system 1000 may be configured to further include an error correction block. The error correction block is configured to detect and correct an error of data that is read from the non-volatile memory device 1100, using an error correction code ECC. As an example, the error correction block is provided as a constituent element of the controller 1200. The error correction block may be provided as a component of the non-volatile memory device 1100.

The controller 1200 and the non-volatile memory device 1100 may be integrated as a single semiconductor device. As an example, the controller 1200 and the non-volatile memory device 1100 may be integrated as a single semiconductor device to constitute a memory card. For example, the controller 1200 and the non-volatile memory device 1100 is integrated as a single semiconductor device to constitute a memory card, such as a PC card (personal computer memory card international association: PCM-CIA), a compact flash card (CF), a smart media card (SM and SMC), a memory stick, a multimedia card (MMC, RS-MMC and MMCmicro), a SD card (SD, mini SD, microSD and SDHC) and a universal flash storage device (UFS).

The controller 1200 and the non-volatile memory device 1100 may be integrated as a single semiconductor device to constitute a semiconductor drive (solid state drive: SSD). The semiconductor drive SSD includes a storage device configured to store data in the semiconductor memory. When the memory system 10 is utilized as the semiconductor drive SSD, the operating speed of the host connected to the memory system 1000 is greatly improved.

As another example, the memory system 1000 is provided as one of various constituent elements of an electronic device, such as a computer, an Ultra Mobile PC (UMPC), a work station, a net-book computer, a personal digital assistant (PDA), a portable computer, a web tablet, a wireless phone, a mobile phone, a smart phone, an e-book, a portable multimedia player (PMP), a portable game console, a navigation device, a black box, a digital camera, a 3-dimensional television set, a digital audio recorder, a digital audio player, a digital picture recorder, a digital picture player, a digital video recorder, a digital video player, devices capable of transmitting and receiving information in a wireless environment, one of various electronic devices constituting a home network, one of various electronic devices constituting a computer network, one of various electronic devices constituting a telematics network, electronic devices, an RFID device or one of various components constituting a computing system.

As an example, the non-volatile memory device 1100 or the memory system 1000 may be mounted as various forms of packages. For example, the non-volatile memory device 1100 or the memory system 1000 may be packaged and mounted, by methods such as Package on Package (PoP), Ball grid arrays (BGAs), Chip scale packages (CSPs), Plastic Leaded Chip Carrier (PLCC), Plastic Dual In Line Package (PDIP), Die in Waffle Pack, Die in Wafer Form, Chip On Board (COB), Ceramic Dual In Line Package (CERDIP), Plastic Metric Quad Flat Pack (MQFP), Thin Quad Flatpack (TQFP), Small Outline (SOIC), Shrink Small Outline Package (SSOP), Thin Small Outline (TSOP), Thin Quad Flatpack (TQFP), System In Package (SIP), Multi Chip Package (MCP), Wafer-Level Fabricated Package (WFP) and Wafer-Level Processed Stack Package (WSP).

FIGS. 15 through 25 are intermediate step diagrams for illustrating a method of manufacturing a non-volatile memory device according to some exemplary implementations. Hereinafter, a method of manufacturing the non-volatile memory device according to some exemplary implementations will be described with reference to FIGS. 15 through 25.

Figure 15:
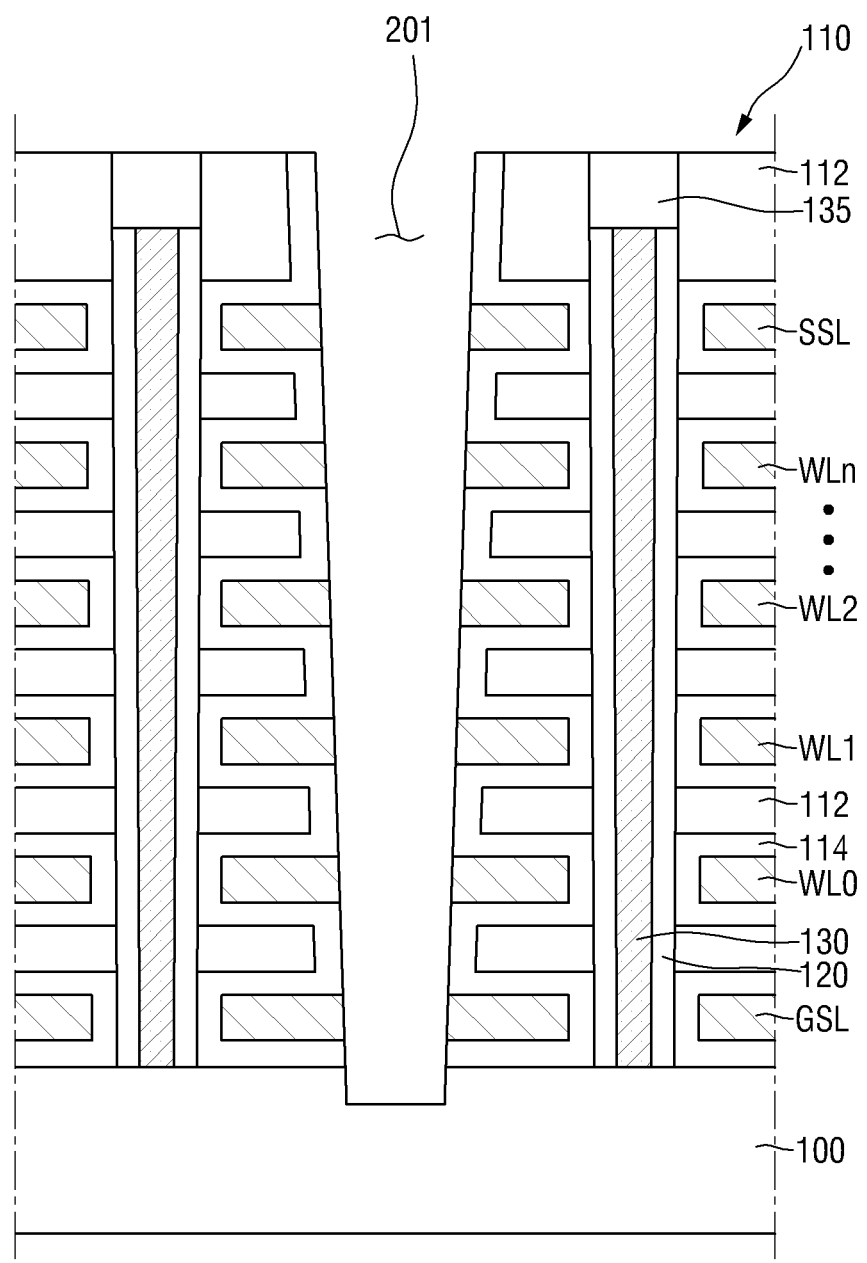
FIGS. 15 through 25 are intermediate step diagrams for illustrating a method of manufacturing a non-volatile memory device according to some exemplary implementations.

First, as shown in FIG. 15, the channel structures 120 and 130 and the electrode structure 110 are formed on the substrate 100. As a method for forming the channel structures 120 and 130 and the electrode structure 110, it is possible to use a method of manufacturing a three-dimensional non-volatile memory device disclosed in the related art.

Next, the first trench 201 that partially exposes the substrate 100 through the electrode structure 110 is formed. The bottom surface of the first trench 201 may be formed to be lower than the top surface of the substrate 100. The first trench 201 may be disposed between the plurality of channel structures 120 and 130, and may partially expose the gate pattern and the block layer 114 included in the electrode structure 110. The first trench 201 may have a tapered shape in which its width becomes wider as it goes from the top to the bottom.

Figure 16:
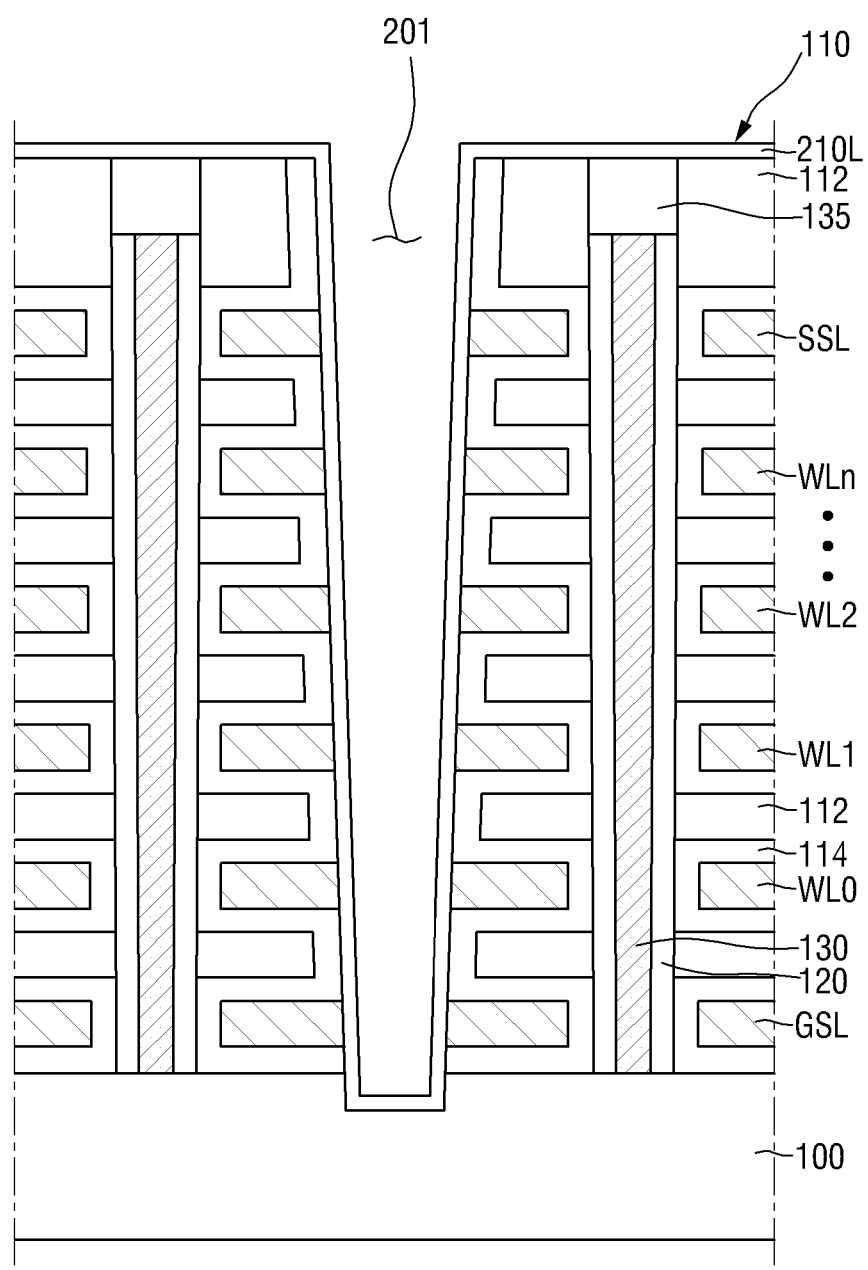

Next, as shown in FIG. 16, a spacer layer 210L is conformally formed along the side surfaces and bottom surface of the first trench 201. The spacer layer 210L may contain at least one insulating material, e.g., silicon oxide.

Figure 17:
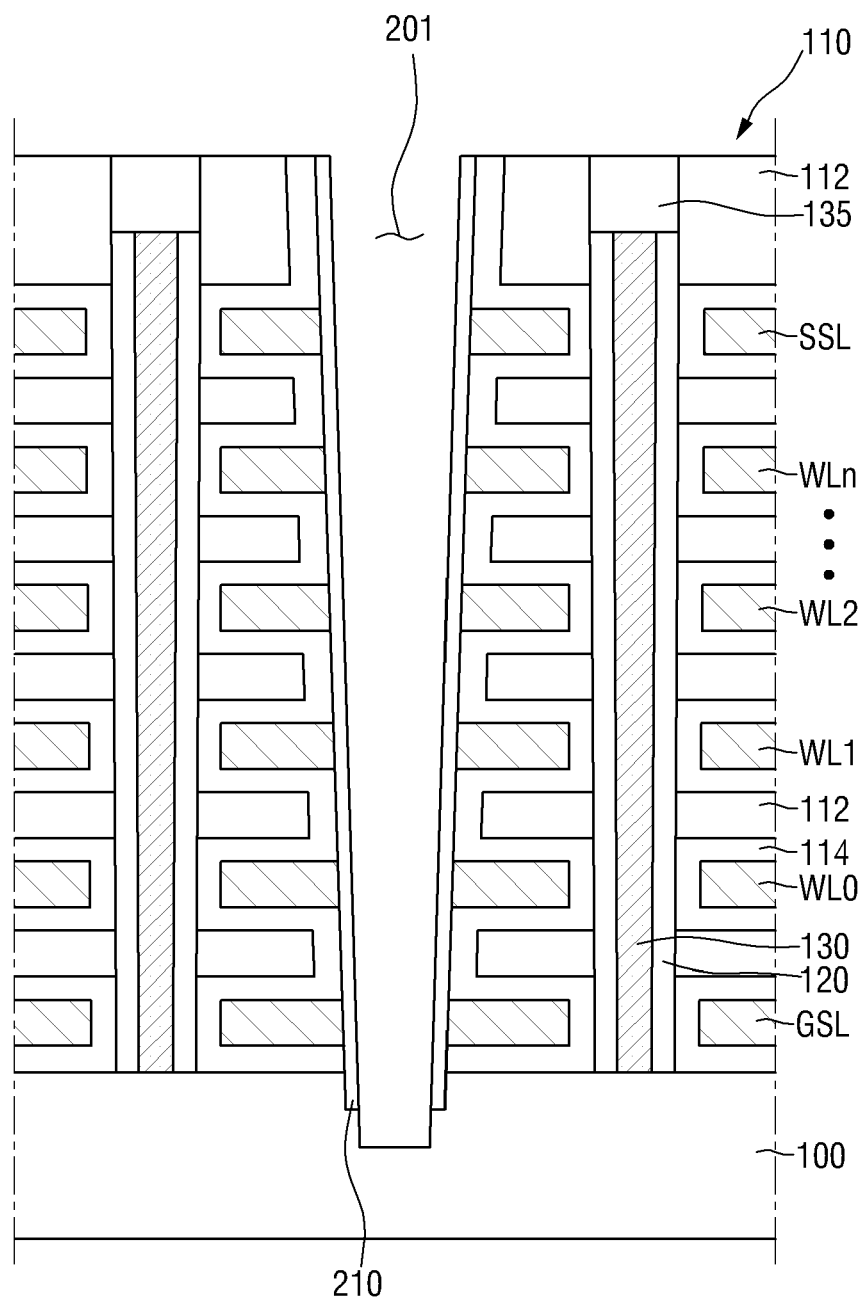

Next, as shown in FIG. 17, through the etching process, the spacer layer 210L disposed on the bottom surface of the first trench 201 and the top surfaces of the channel structures 120 and 130 and the electrode structure 110 is removed. The bottom surface of the first trench 201 may be formed to be deeper than the bottom surface of the spacer 210 in the etching process. Therefore, a further step may occur on the bottom surface of the first trench 201. Both the anisotropic etching and the isotropic etching may be used in the etching process, but the present inventive concept is not limited thereto. Thus, the spacer 210 may be left only on the side walls of the electrode structure 110.

Figure 18:
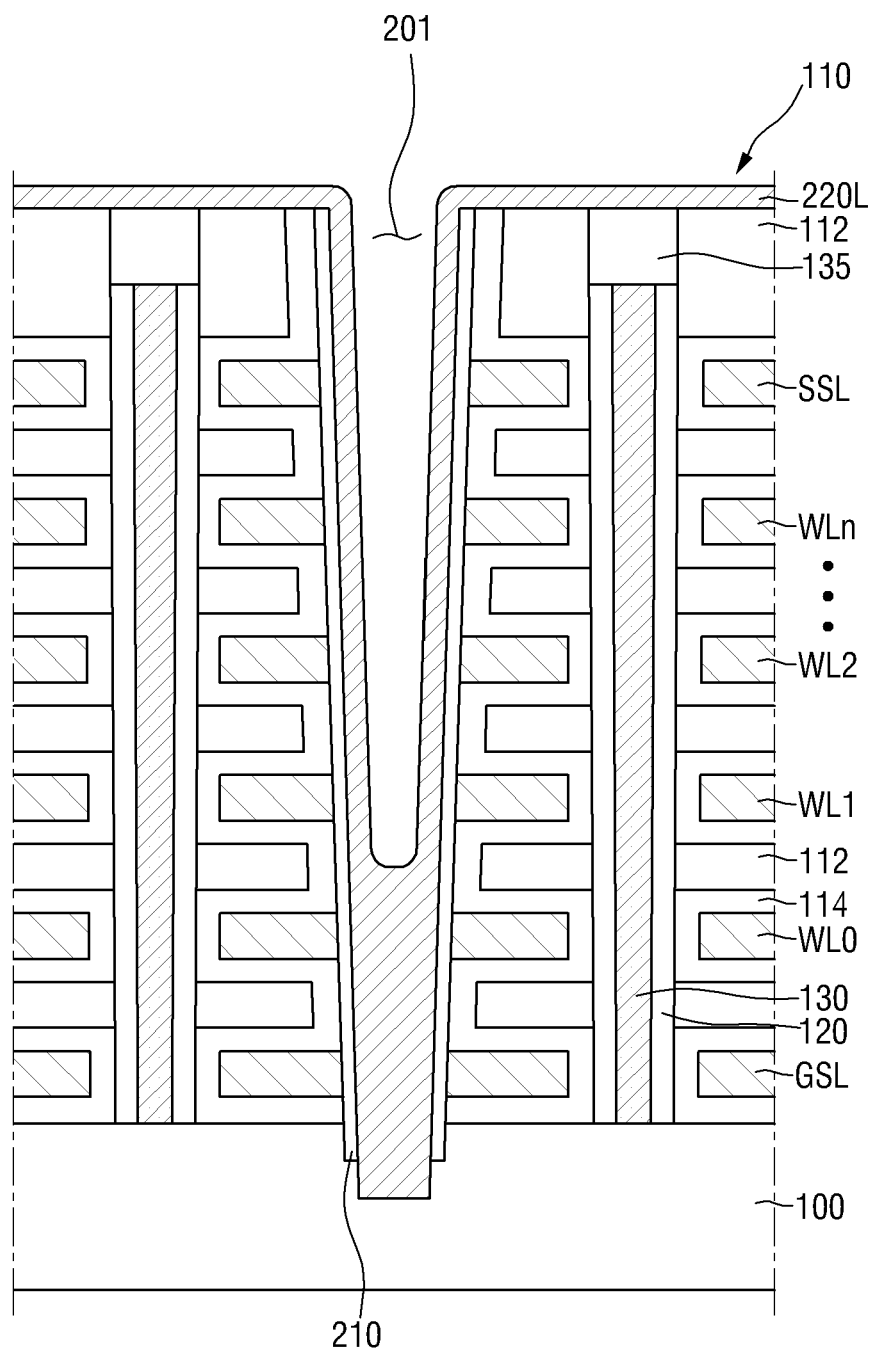

Next, referring to FIG. 18, the conductive layer 220L is formed in the first trench 201. The conductive layer 220L is located on the spacer 210 and may extend long along the top surface of the spacer 210, and may fill up the bottom of the first trench 201. The conductive layer 220L fills up only the bottom of the first trench 201 and may not completely fill up the top of the first trench 201.

The conductive layer 220L may contain a metallic material or a metallic compound. For example, the conductive pattern 220 may contain tungsten (W). However, the present inventive concept is not limited thereto, and for example, the conductive pattern may contain at least one of polysilicon, a metal silicide compound, a conductive metal nitride and metal.

Figure 19:
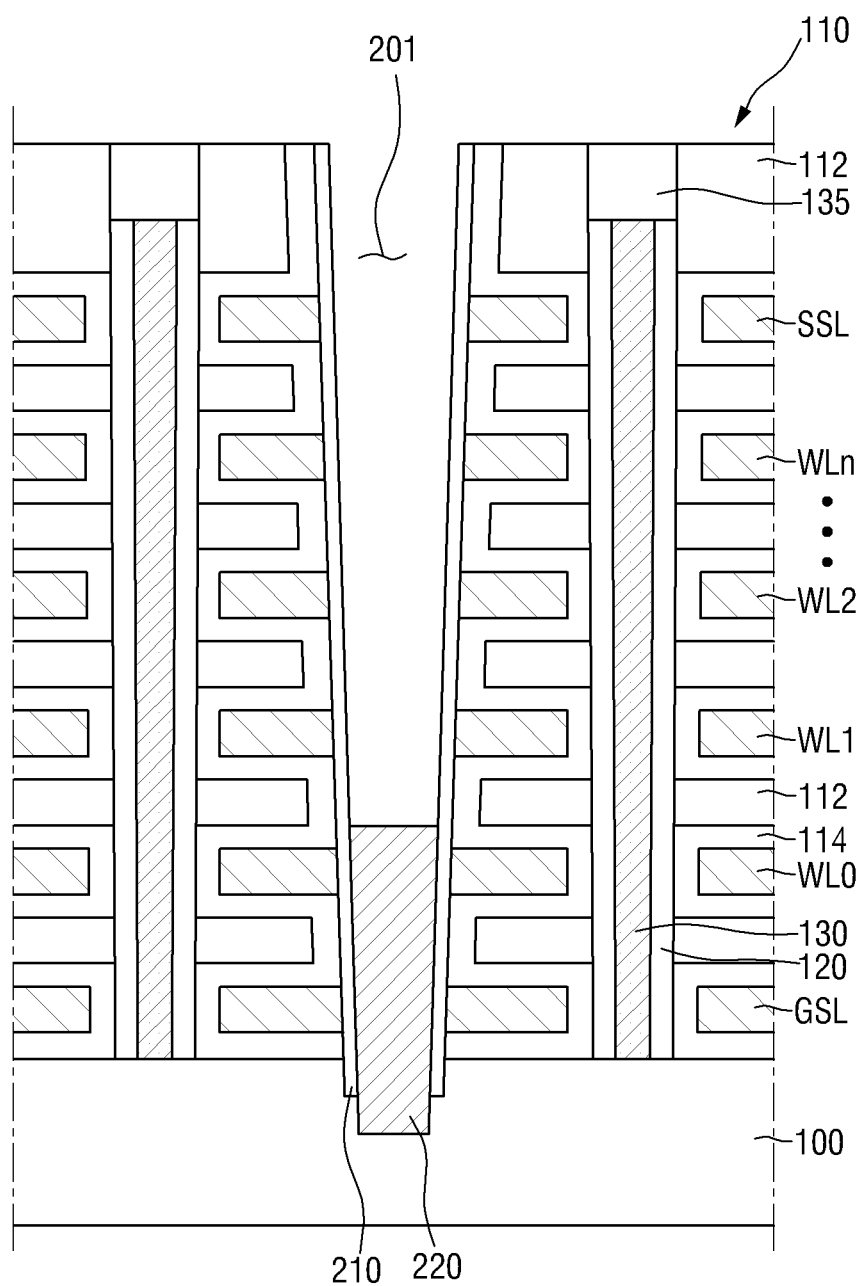

Next, as shown in FIG. 19, a conductive pattern 220 is formed by partially etching the conductive layer 220L through the etching process. The conductive pattern 220 may be located only in the lower part of the first trench 201. In the etching process, both the anisotropic etching and the isotropic etching may be used, and both the dry etching and the wet etching may be used.

Thus, the top surface of the conductive pattern 220 is formed to be higher than the top surface of the substrate 100 and may be formed to be lower than the top surfaces of the channel structures 120 and 130.

Figure 20:
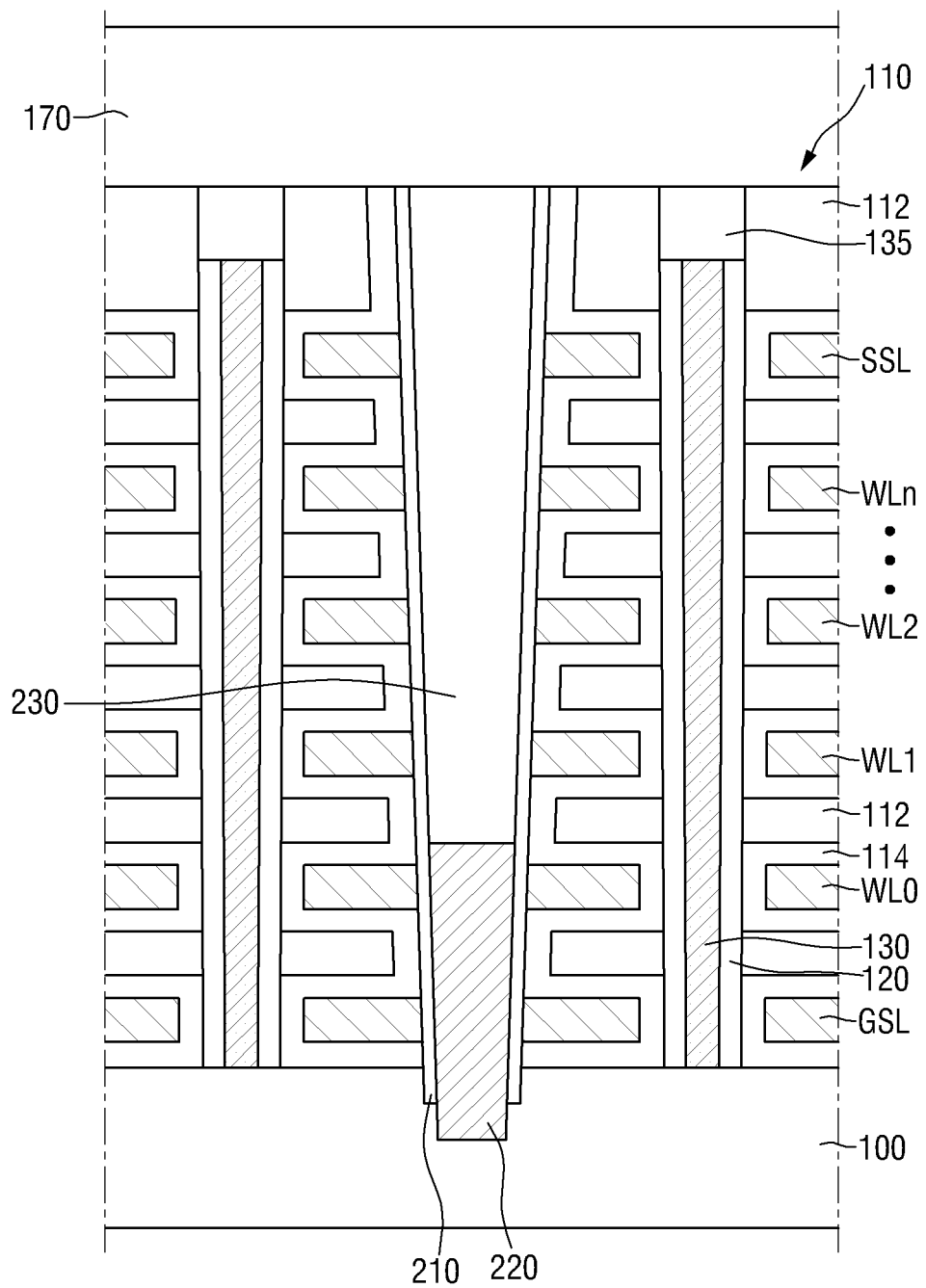

Next, as shown in FIG. 20, the insulating layer 230 that fills up the first trench 201 is formed. The insulating layer 230 may be formed on the conductive pattern 220 within the first trench 201. The insulating layer 230 is in contact with the top surface of the conductive pattern 220 and may be formed along the side surfaces of the electrode structure 110. Next, a planarization process (e.g., a CMP process) is performed so that the top surface of the insulating layer 230 and the top surface of the electrode structure 110 are parallel to each other. Thus, the top surface of the insulating layer 230 may be located on the same plane as the top surface of the channel pad 135 or the top surface of the electrode structure 110. The insulating layer 230 may be made of a material having a dielectric constant. In some embodiments of the present inventive concept, the insulating layer 230, for example, may be made of a material, such as HfO2, Al2O3, ZrO2 and TaO2, but the present inventive concept is not limited thereto.

Next, a first interlayer insulating film 170 that covers the channel structures 120 and 130, the channel pad 135, the electrode structure 110 and the insulating layer 230 is formed. The first interlayer insulating film 170 may take charge of the electrical insulation between the semiconductor elements located below the first interlayer insulating film 170 and the semiconductor elements located above the first interlayer insulating film 170.

Figure 21:
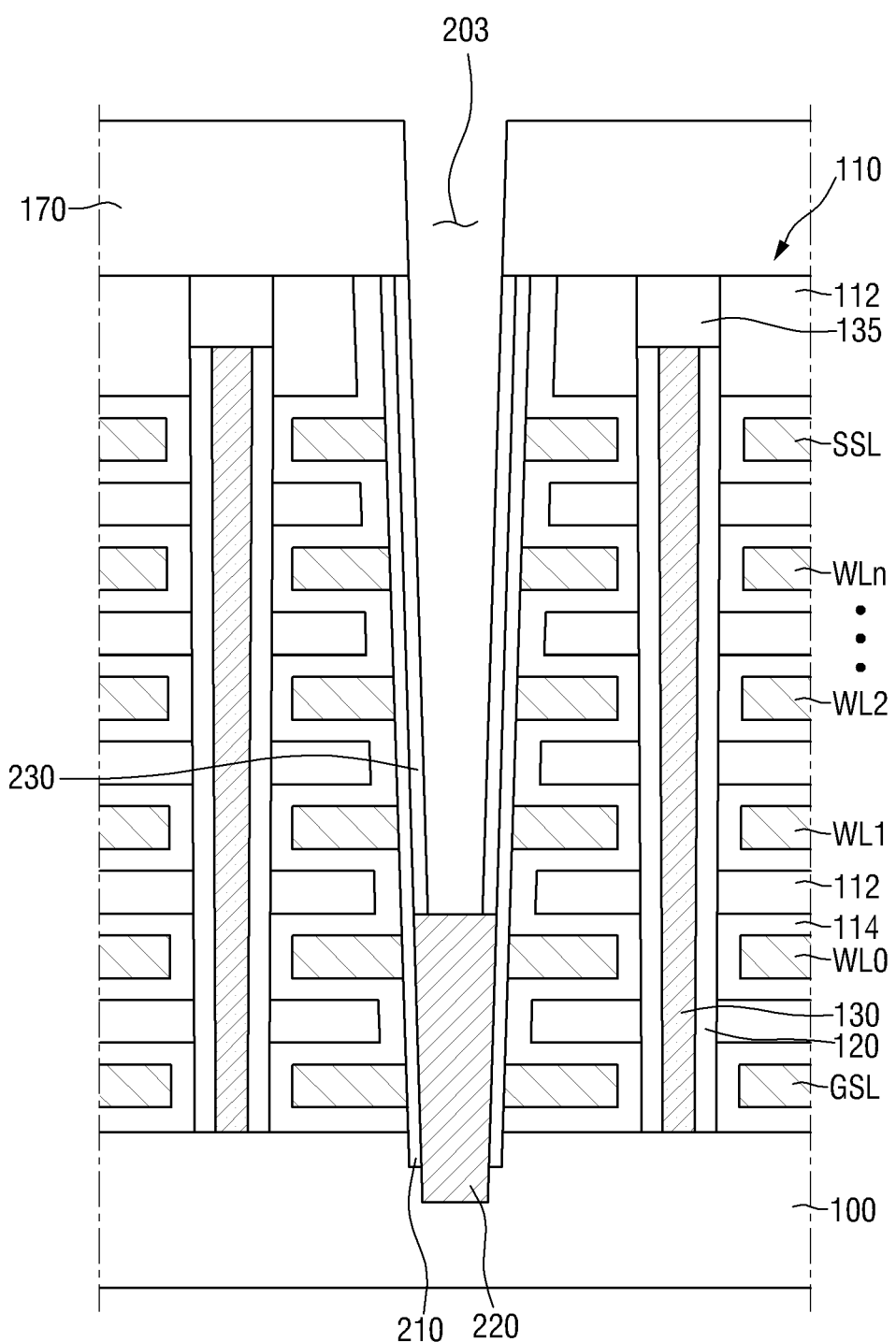

Next, as shown in FIG. 21, a second trench 203 that partially exposes of the top surface of the conductive pattern 220 is formed through the first interlayer insulating film 170 and the insulating layer 230.

Figure 22:
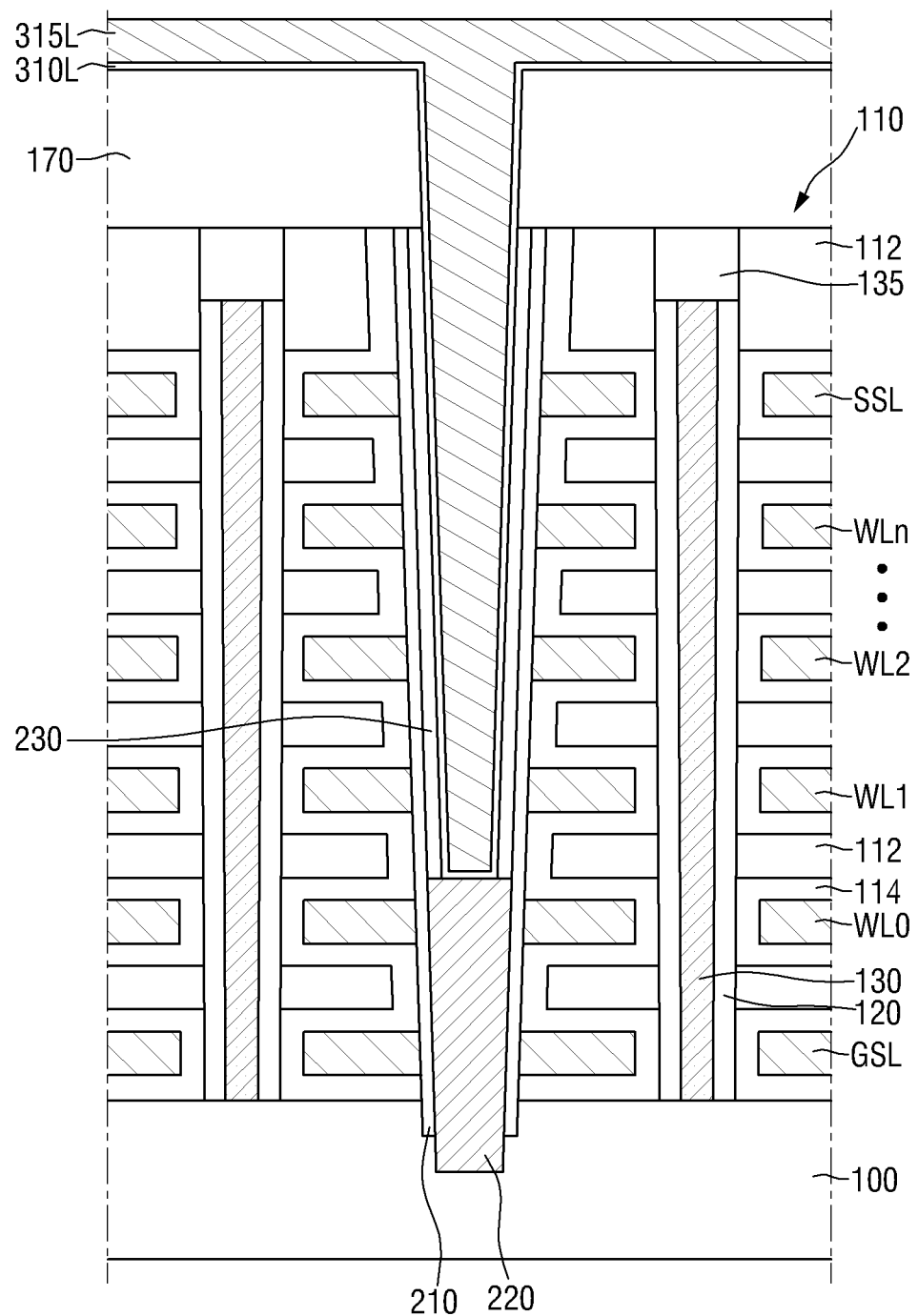

Next, as shown in FIG. 22, the first barrier metal layer 310L conformally formed along the inner surface of the second trench is formed. The first barrier metal layer 310L may contain titanium (Ti), titanium nitride (TiN) or tungsten nitride (WN). The first barrier metal layer 310L may be formed using PVD, CVD or ILD methods. However, the present inventive concept is not limited thereto.

Next, the metal contact layer 315L is formed on the first barrier metal layer 310L. The metal contact layer 315L may be formed to embed the second trench 203. The metal contact layer 315L may be electrically connected to the conductive pattern 220. The metal contact layer 315L may contain a metallic material or a metallic compound. For example, the metal contact layer 315L may contain tungsten (W). However, the present inventive concept is not limited thereto, and for example, may contain at least one of polysilicon, a metal silicide compound, a conductive metal nitride and metals.

Figure 23:
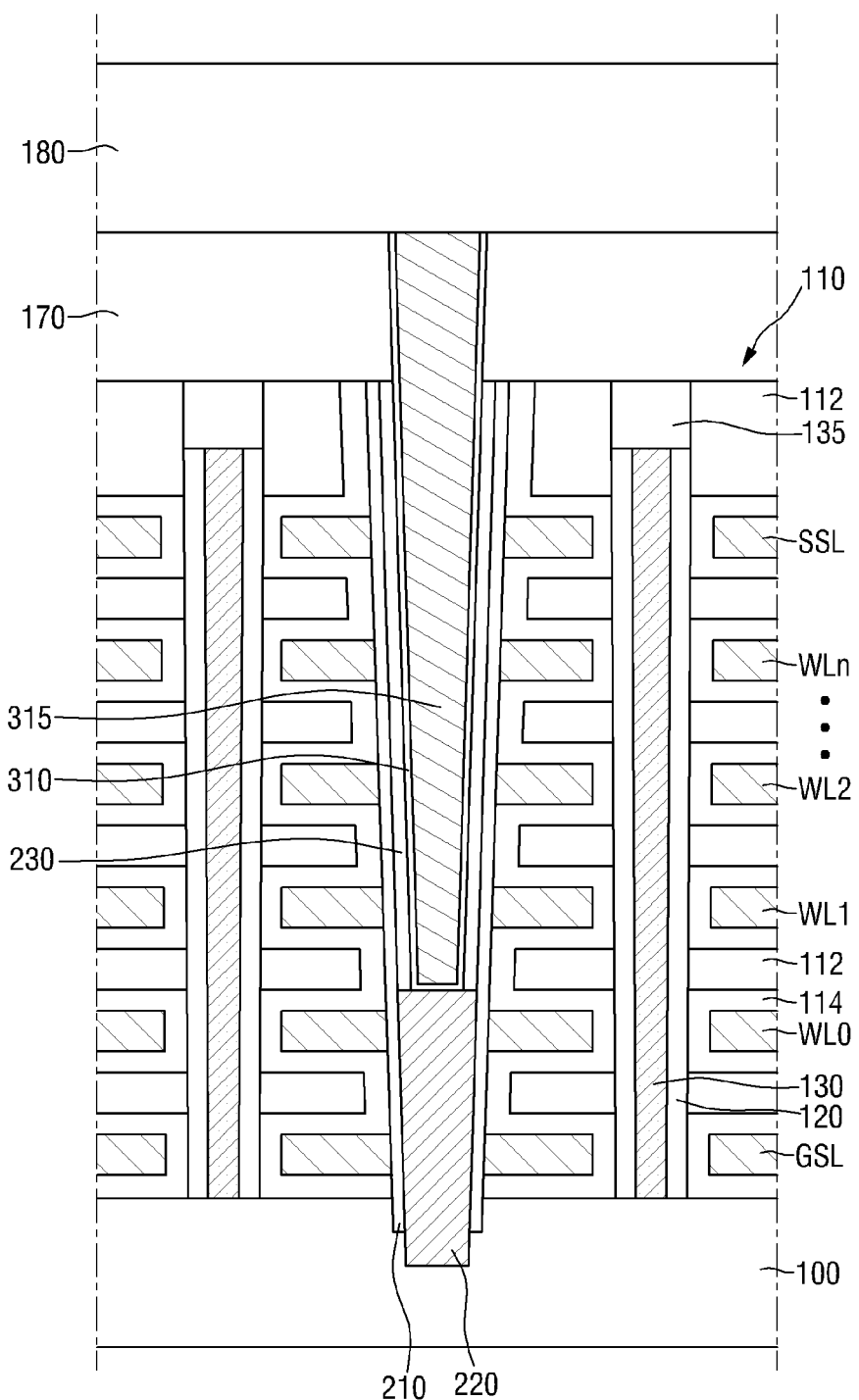

Next, as shown in FIG. 23, a planarization process (e.g., a CMP process) is performed so that the top surface of the first interlayer insulating film 170 and the top surface of the metal contact 315 are parallel to each other. Thus, the top surface of the metal contact 315 layer and the top surface of the first interlayer insulating film 170 are located on the same plane.

Next, a second interlayer insulating film 180 that covers the first interlayer insulating film 170 is formed. The second interlayer insulating film 180 may take charge of the electrical insulation between the semiconductor elements located below the second interlayer insulating film 180 and the semiconductor elements located above the second interlayer insulating film 180. The second interlayer insulating film 180 may contain the same material as the first interlayer insulating film 170, but the present inventive concept is not limited thereto.

Figure 24:
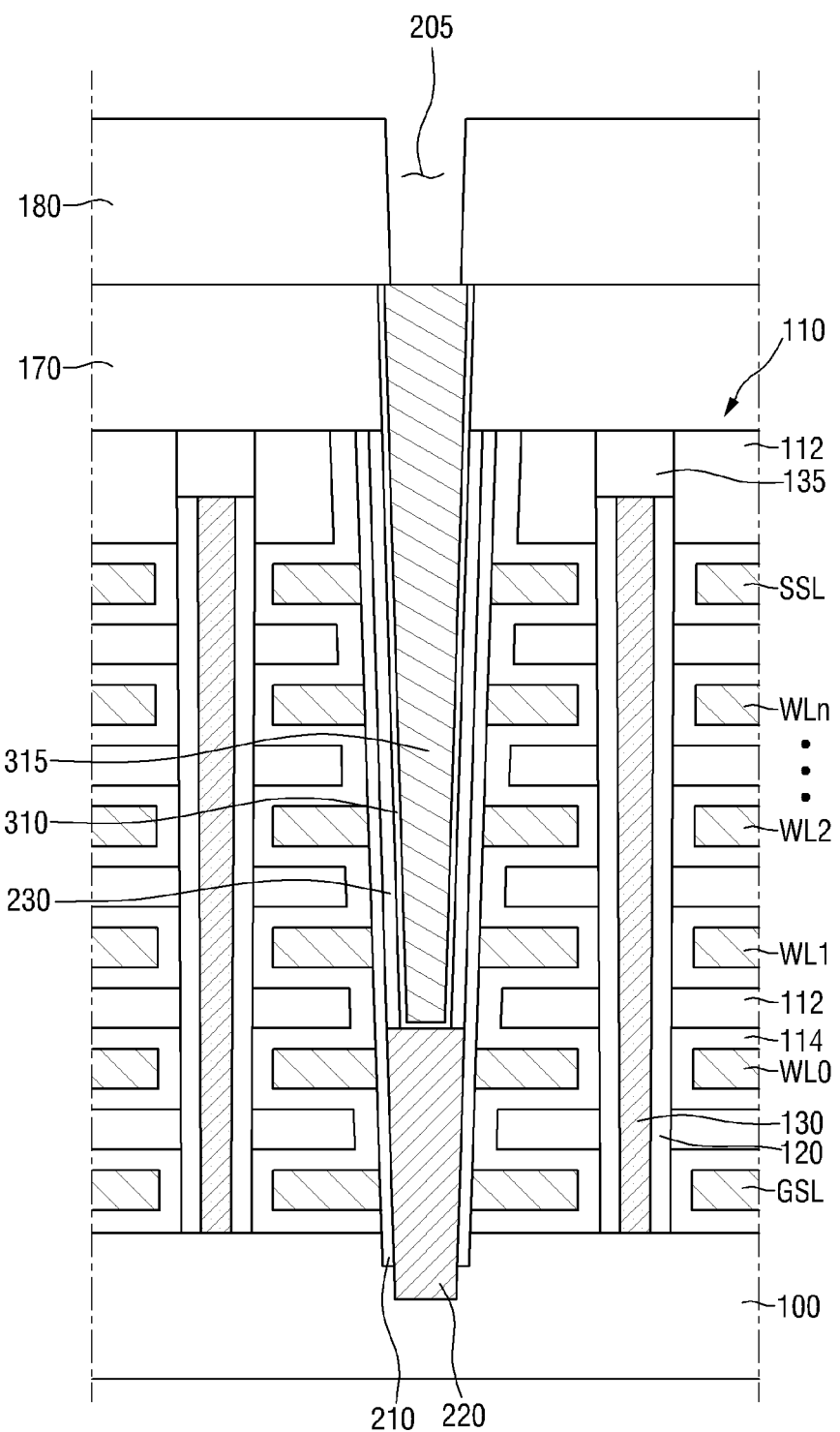

Next, as shown in FIG. 24, a third trench 205 that partially exposes the metal contact 315 is formed.

Figure 25:
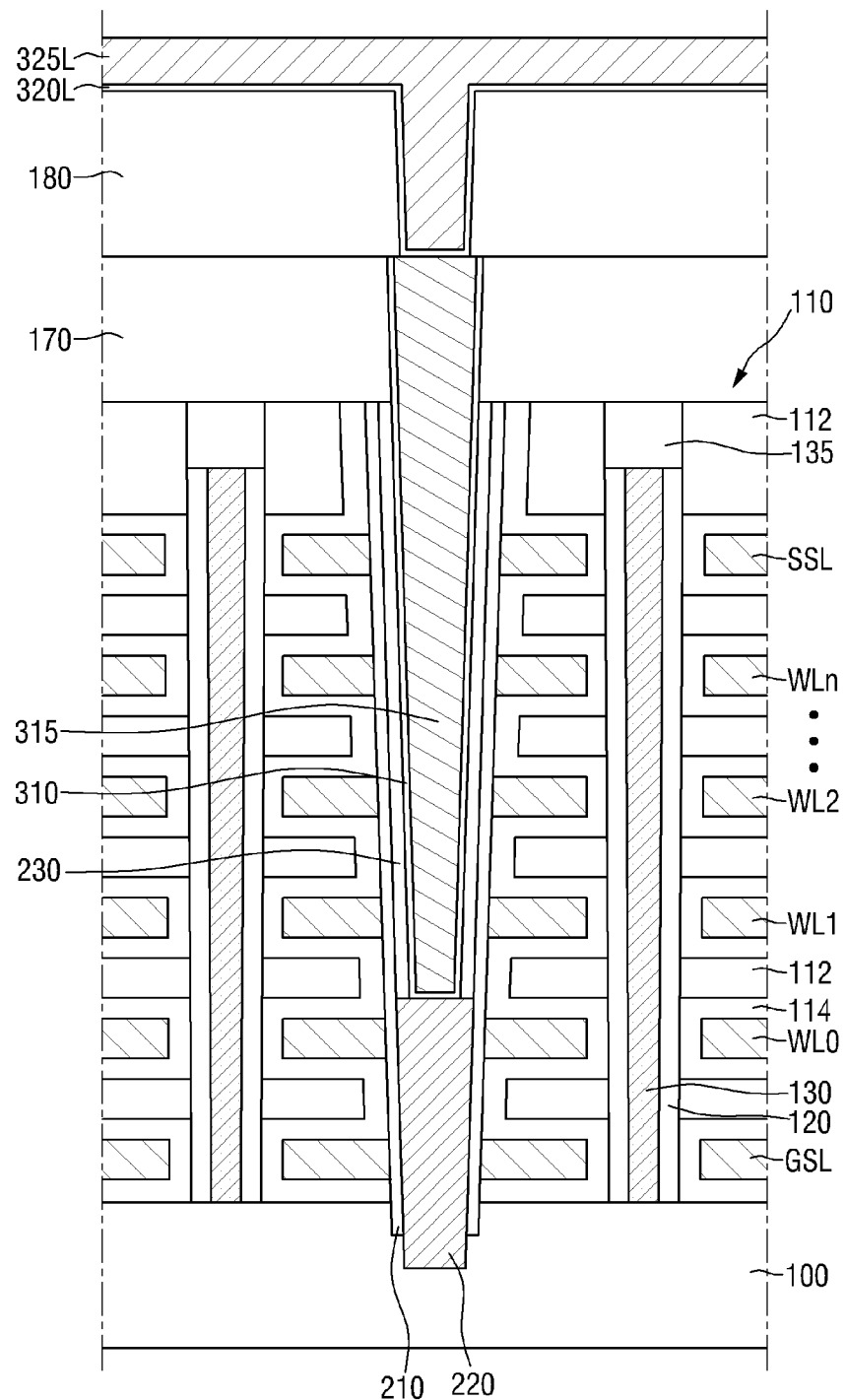

Next, as shown in FIG. 25, a second barrier metal layer 320L conformally formed along the inner surface of the third trench is formed. The second barrier metal layer 320L may contain titanium (Ti), titanium nitride (TiN) or tungsten nitride (WN). The second barrier metal layer 320L may be formed using PVD, CVD or ILD methods. However, the present inventive concept is not limited thereto.

Next, the first conductive stud layer 325L is formed on the second barrier metal layer 320L. The first conductive stud layer 325L may be formed to embed the third trench 205. The first conductive stud layer 325L may be electrically connected to the conductive pattern 220. The first conductive stud layer 325L may contain a metallic material or a metallic compound. For example, the first conductive stud layer 325L may contain tungsten (W). However, the present inventive concept is not limited thereto, and for example, the first conductive stud layer may contain at least one of polysilicon, a metal silicide compound, a conductive metal nitride and metals.

Next, as shown in FIG. 3, a planarization process (e.g., a CMP process) is performed so that the top surface of the second interlayer insulating film 180 and the top surface of the first conductive stud 325 are parallel to each other. Thus, the top surface of the first conductive stud 325 and the top surface of the second interlayer insulating film 180 are also located on the same plane.

Consequently, the height of the conductive pattern 220 is formed to be lower than the top surfaces of the channel structures 120 and 130, and the metal contact 315 may be disposed between the first conductive stud 325 and the conductive pattern 220. Thus, the non-volatile memory device according to some embodiments of the present inventive concept may remove the slit area in the conductive pattern formed by the F-gas to reduce the stress applied by the conductive pattern. Moreover, it is possible to have an effect of reducing the failure rate of the non-volatile memory device and improving performance.

While the present inventive concept has been particularly illustrated and described with reference to exemplary implementations thereof, it will be understood by those of ordinary skill in the art that various changes in form and detail may be made therein without departing from the spirit and scope of the present inventive concept as defined by the following claims. The exemplary implementations should be considered in a descriptive sense only and not for purposes of limitation.

What is claimed is:

1. A non-volatile memory device comprising:
   a channel structure that is located on a substrate and extends perpendicularly to the substrate;
   a conductive pattern that extends perpendicularly to the substrate and is spaced apart from the channel structure;
   an electrode structure that is located between the channel structure and the conductive pattern, and comprises a plurality of gate patterns and a plurality of insulation patterns that are alternately laminated; and
   an insulating layer that is in contact with a top surface of the conductive pattern and is formed along side surfaces of the electrode structure,
   wherein the top surface of the conductive pattern is formed to be lower than a top surface of the channel structure.

2. The non-volatile memory device of claim 1, wherein the top surface of the conductive pattern is formed to be higher than a top surface of the substrate.

3. The non-volatile memory device of claim 1, further comprising:
a spacer that is disposed between the conductive pattern and the electrode structure and is formed along side surfaces of the conductive pattern and side surfaces of the insulating layer, and
a bottom surface of the conductive pattern is formed to be lower than a bottom surface of the spacer.

4. The non-volatile memory device of claim 1, further comprising:
a first interlayer insulating film that covers the channel structure and the electrode structure; and
a metal contact structure that is in contact with the top surface of the conductive pattern through the first interlayer insulating film.

5. The non-volatile memory device of claim 4, further comprising:
a second interlayer insulating film that covers the first insulating interlayer film;
a first conductive stud that is disposed on the metal contact structure through the second interlayer insulating film; and
a second conductive stud that is disposed on the channel structure through the first and second interlayer insulating films.

6. The non-volatile memory device of claim 5, wherein the first conductive stud and a metal contact of the metal contact structure are integrally formed.

7. A non-volatile memory device comprising:
a plurality of channel structures that is located on a substrate and extends perpendicularly to the substrate;
a conductive pattern that extends perpendicularly to the substrate and is spaced apart from the channel structure;
a first interlayer insulating film that covers a plurality of channel structures and the conductive pattern; and
a metal contact that is disposed on the conductive pattern, is electrically connected to the conductive pattern, passes through the first interlayer insulating film, and has a bottom surface formed to be lower than top surfaces of the plurality of channel structures.

8. The non-volatile memory device of claim 7, wherein a top surface of the conductive pattern is formed to be higher than a top surface of the substrate and to be lower than the top surfaces of the plurality of channel structures.

9. The non-volatile memory device of claim 7, wherein the plurality of channel structures are disposed in a honeycomb pattern.

10. The non-volatile memory device of claim 7, wherein the conductive pattern comprises a first portion including the metal contact, and a second portion adjacent to the first portion, and
a width of the first portion measured in a first direction parallel to a top surface of the substrate is larger than a width of the second portion measured in the first direction.

11. A non-volatile memory device comprising:
first and second channel structures that are located on a substrate and extend perpendicularly to the substrate;
a conductive pattern that extends perpendicularly to the substrate and is spaced apart from the first and second channel structures;
a first interlayer insulating film that covers the first and second channel structures and the conductive pattern;
a second interlayer insulating film that covers the first interlayer insulating film;
a metal contact that is disposed on the conductive pattern and penetrates through the first interlayer insulating film;
a first conductive stud that is disposed on the metal contact, penetrates through the second interlayer insulating film and is electrically connected to the conductive pattern; and
a second conductive stud that is disposed only on the first channel structure, is not disposed on the second channel structure and penetrates through the first and second interlayer insulating films.

12. The non-volatile memory device of claim 11, wherein a distance between the first channel structure and the metal contact is larger than a distance between the first channel structure and the metal contact.

13. The non-volatile memory device of claim 11, wherein a top surface of the conductive pattern is formed to be lower than top surfaces of the channel structures.

14. A non-volatile memory device comprising:
a vertical NAND string that is located on a substrate and extends perpendicularly to the substrate, the vertical NAND string comprising a plurality of serially connected memory cells; and
a common source line that is spaced apart from the vertical NAND string, and that extends perpendicularly from a first location in contact with the substrate to a second location at least as high as the top of the vertical NAND string, the common source line comprising a conductive pattern extending from the first location to a height at least as high as a first memory cell of the plurality of serially connected memory cells and a metal contact electrically connected to the conductive pattern and extending from the second location to a depth of a portion of the vertical NAND string.

15. The non-volatile memory device of claim 14, further comprising an electrode structure that is located between the vertical NAND string and the common source line, and comprises a plurality of gate patterns and a plurality of insulation patterns that are alternately laminated above the substrate,
wherein the height of the first location above the substrate is at a height below the third closest gate pattern to the substrate of said electrode structure.

16. The non-volatile memory device of claim 15, further comprising an insulating layer that contacts a top surface of the common source line and is formed along side surfaces of the electrode structure.

17. The non-volatile memory device of claim 15, further comprising:
a first interlayer insulating film that covers the vertical NAND string and the electrode structure,
wherein the metal contact extends through the first interlayer insulating film and contacts a top surface of the conductive pattern.

18. The non-volatile memory device of claim 17, wherein the common source line is formed within a contact hole extending at least between the second location to the first location.

19. A non-volatile memory device comprising:
a channel disposed on a substrate and extending in a first direction that is substantially perpendicular to the substrate;
a first conductive pattern contacting the substrate and extending in the first direction, the first conductive pattern spaced apart from the channel, wherein the first conductive pattern is a line type extending in a second direction that is substantially perpendicular with respect to the first direction;

a second conductive pattern disposed on the first conductive pattern;

a plurality of electrodes stacked in the first direction comprising a first electrode and a second electrode, the first electrode disposed between the channel and the first conductive pattern, the second electrode disposed between the channel and the second conductive pattern;

a first barrier layer extending in the first direction along a side of the first conductive pattern and a side of the second conductive pattern; and a second barrier layer extending in the first direction along the side of the second conductive pattern.

20. A non-volatile memory device comprising:

a vertical NAND string that is disposed on a substrate and extends substantially perpendicularly to the substrate, the vertical NAND string comprising a plurality of word lines, a String Selection Line (SSL) and a Ground Selection Line (GSL); and a common source line that is spaced apart from the vertical NAND string, wherein the common source line includes a first conductive pattern and a second conductive pattern, and wherein the first conductive pattern extends substantially perpendicularly from a first end in contact with the substrate to a second end disposed under a bottom surface of the SSL in contact with a bottom of the second conductive pattern, and wherein the first conductive pattern comprises polysilicon and the second conductive pattern comprises tungsten.

21. The non-volatile memory device of claim 20, wherein the first conductive pattern is a line type.

22. The non-volatile memory device of claim 19, wherein the second electrode is the topmost electrode among the plurality of electrodes and a bottom surface of the second conductive pattern is disposed lower than a bottom surface of the second electrode.

23. The non-volatile memory device of claim 7, wherein the conductive pattern is a line type extending in a direction that is substantially perpendicular to the substrate.

24. The non-volatile memory device of claim 11, further comprising:

a first barrier layer along a side of the conductive pattern and a side of the metal contact; and a second barrier layer along the side of the metal contact on the conductive pattern.

25. The non-volatile memory device of claim 24, wherein a bottom surface of the conductive pattern is formed to be lower than a bottom surface of the first barrier layer.

26. The non-volatile memory device of claim 19, wherein a top surface of the first conductive pattern is disposed higher than a top surface of the substrate.

27. The non-volatile memory device of claim 19, further comprising:

a first interlayer insulating film that covers the channel and the plurality of electrodes;

a second interlayer insulating film that covers the first interlayer insulating film;

a first conductive stud that is disposed on the second conductive pattern through the second interlayer insulating film; and a second conductive stud that is disposed on the channel through the first and second interlayer insulating films.

28. The non-volatile memory device of claim 20, further comprising a first interlayer insulating film that covers the vertical NAND string, wherein the second conductive pattern penetrates through the first interlayer insulating film.

29. The non-volatile memory device of claim 28, further comprising:

a second interlayer insulating film that is disposed on the first interlaying insulating film; and a conductive stud that is disposed on the second conductive pattern through the second interlayer insulating film.

30. The non-volatile memory device of claim 20, further comprising:

a first barrier layer extending along a side of the first conductive pattern and a side of the second conductive pattern; and a second barrier layer extending along the side of the second conductive pattern.

* * * * *